(12) United States Patent
Matsuoka et al.

(10) Patent No.: US 9,479,154 B2
(45) Date of Patent: Oct. 25, 2016

(54) SEMICONDUCTOR INTEGRATED CIRCUIT

(71) Applicant: Panasonic Intellectual Property Management Co., Ltd., Osaka (JP)

(72) Inventors: Daisuke Matsuoka, Osaka (JP); Masahiro Gion, Kyoto (JP); Shiro Usami, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 98 days.

(21) Appl. No.: 14/633,027

(22) Filed: Feb. 26, 2015

(65) Prior Publication Data

US 2015/0171858 A1  Jun. 18, 2015

Related U.S. Application Data

(63) Continuation of application No. PCT/JP2013/003976, filed on Jun. 25, 2013.

(30) Foreign Application Priority Data

Sep. 6, 2012 (JP) ................................ 2012-196032

(51) Int. Cl.
| | |
|---|---|
| *H03B 1/00* | (2006.01) |
| *H03K 3/00* | (2006.01) |
| *H03K 17/16* | (2006.01) |
| *H03K 3/356* | (2006.01) |
| *H03K 19/00* | (2006.01) |
| *H03K 3/012* | (2006.01) |

(52) U.S. Cl.
CPC ............ *H03K 17/165* (2013.01); *H03K 3/012* (2013.01); *H03K 3/35613* (2013.01); *H03K 19/0016* (2013.01)

(58) Field of Classification Search
USPC .................................................. 327/108–112
See application file for complete search history.

(56) References Cited

U.S. PATENT DOCUMENTS

| | | | |
|---|---|---|---|
| 5,610,533 A | 3/1997 | Arimoto et al. | |
| 6,674,304 B1 * | 1/2004 | Matthews ............ | H03K 17/167 326/63 |
| 6,919,743 B2 * | 7/2005 | Tobita .................. | G09G 3/3688 326/62 |
| 7,576,574 B2 * | 8/2009 | Noda ................. | H05B 33/0812 327/108 |
| 8,653,861 B2 * | 2/2014 | Noguchi ................ | H03K 5/133 327/108 |

(Continued)

FOREIGN PATENT DOCUMENTS

| | | |
|---|---|---|
| JP | 08-017183 A | 1/1996 |
| JP | 2008-010940 A | 1/2008 |
| JP | 2008-118582 A | 5/2008 |

OTHER PUBLICATIONS

International Search Report issued in International Application No. PCT/JP2013/003976 dated Sep. 3, 2013, with English translation.

*Primary Examiner* — Adam Houston
(74) *Attorney, Agent, or Firm* — McDermott Will & Emery LLP

(57) ABSTRACT

A semiconductor integrated circuit includes a power supply switch circuit which uses a PMOS transistor and an NMOS transistor to select a first power supply voltage applied to a first power supply input terminal or a second power supply voltage applied to a second power supply input terminal, and output the selected voltage as a power supply voltage to a third power supply output terminal, a first switch control circuit connected to the gate of the PMOS transistor, and a second switch control circuit connected to the gate of the NMOS transistor.

20 Claims, 8 Drawing Sheets

(56) References Cited

U.S. PATENT DOCUMENTS

| | | |
|---|---|---|
| 2006/0214722 A1 | 9/2006 | Hirose et al. |
| 2006/0232307 A1* | 10/2006 | Kanno ............... H01L 27/0928 327/112 |
| 2006/0290390 A1* | 12/2006 | Jang ..................... G11C 19/28 327/112 |
| 2010/0013547 A1 | 1/2010 | Oka |
| 2011/0258427 A1* | 10/2011 | Kanamori ............. G01C 21/26 713/2 |
| 2013/0091323 A1* | 4/2013 | Kanamori ............... G06F 9/445 711/103 |
| 2013/0113524 A1* | 5/2013 | Rueger ................ H03F 3/2171 327/109 |
| 2015/0171858 A1* | 6/2015 | Matsuoka .......... H03K 3/35613 327/109 |
| 2016/0065047 A1* | 3/2016 | Seaberg ................ H03K 3/012 327/109 |
| 2016/0072327 A1* | 3/2016 | Knutson ............... G06F 1/1632 320/108 |
| 2016/0188245 A1* | 6/2016 | Thadi Suryaprakash ....... G06F 3/0625 710/13 |

* cited by examiner

SEMICONDUCTOR INTEGRATED CIRCUIT

CROSS-REFERENCE TO RELATED APPLICATIONS

This is a continuation of International Application No. PCT/JP2013/003976 filed on Jun. 25, 2013, which claims priority to Japanese Patent Application No. 2012-196032 filed on Sep. 6, 2012. The entire disclosures of these applications are incorporated by reference herein.

BACKGROUND

The present disclosure relates to semiconductor integrated circuits which include a power supply switch circuit having the function of switching power supply voltages to be supplied.

Typically, when a higher signal frequency is employed in order to provide a higher-speed interface, the signal voltage level is reduced in order to reduce the increase in power consumption. For example, while SD cards that comply with the traditional interface standard use a 3.3-V signal interface, SD cards that comply with the state-of-the-art high-speed standard use a 1.8-V signal interface. In the case of interface standards widely used such as the Secure Digital standard, devices are required to support both new and old standards, and therefore, interface circuits need to switch signal voltage levels, depending on the standard with which a connected SD card complies. Therefore, a power supply switch circuit is needed which switches a power supply voltage supplied to the interface circuit between 3.3 V and 1.8 V.

SUMMARY

Such a power supply switch circuit typically includes a PMOS transistor. However, when there is a large difference between the power supply voltages, such as 3.3 V and 1.8 V for the above SD card interface, then if a 3.3-V power supply input terminal and a 1.8-V power supply input terminal are connected to respective power supply output terminals by respective PMOS transistors, a current flows due to a parasitic diode. Specifically, when 3.3 V is output to the power supply output terminal, the drain voltage and substrate voltage of the PMOS transistor connected to the 1.8-V power supply input terminal are 3.3 V and 1.8 V, respectively, so that a current flows due to a parasitic diode between the drain and the substrate. Thus, a current flows backward to the 1.8-V power supply input terminal, and therefore, in some cases, a serious problem may occur, including a device breakdown, latchup, malfunction, etc.

Therefore, for example, as described in Japanese Unexamined Patent Publication No. 2008-118582, the above parasitic diode current can be prevented or reduced by controlling the substrate voltage of the PMOS transistor so that it is higher than the drain voltage. Note that, in Japanese Unexamined Patent Publication No. 2008-118582, it is assumed that all power supplies are on, and therefore, the parasitic diode current disadvantageously occurs when any of the power supplies is off, or is rising, i.e., in the transient state.

The present disclosure describes implementations of a semiconductor integrated circuit including a power supply switch circuit which does not cause an unwanted current, such as the parasitic diode current, etc., even when any of the power supplies is off.

A first example semiconductor integrated circuit according to the present disclosure includes a ground terminal configured to receive a ground potential, a first power supply terminal configured to receive a first power supply voltage higher than the ground potential, a second power supply terminal configured to receive a second power supply voltage higher than the ground potential and lower than the first power supply voltage, a third power supply terminal configured to output the first power supply voltage received by the first power supply terminal or the second power supply voltage received by the second power supply terminal, a first PMOS transistor configured to connect the first and third power supply terminals together, a first NMOS transistor configured to connect the second and third power supply terminals together, a first switch control circuit connected to the first PMOS transistor, and a second switch control circuit connected to the first NMOS transistor. The first switch control circuit outputs a signal ranging from the level of the ground potential to the level of the first power supply voltage to a gate of the first PMOS transistor, to control the first PMOS transistor so that the first PMOS transistor is on or off. The second switch control circuit outputs a signal ranging from the level of the ground potential to the level of the first power supply voltage to a gate of the first NMOS transistor, to control the first NMOS transistor so that the first NMOS transistor is on or off.

A second example semiconductor integrated circuit according to the present disclosure includes a ground terminal configured to receive a ground potential, a first power supply terminal configured to receive a first power supply voltage higher than the ground potential, a second power supply terminal configured to receive a second power supply voltage higher than the ground potential and lower than the first power supply voltage, a third power supply terminal configured to output the first power supply voltage received by the first power supply terminal or the second power supply voltage received by the second power supply terminal, a first PMOS transistor configured to connect the first and third power supply terminals together, a second PMOS transistor configured to connect the second and third power supply terminals together, a first switch control circuit connected to the first PMOS transistor, a second switch control circuit connected to the second PMOS transistor, and a substrate control circuit having an output connected to a substrate electrode of the second PMOS transistor. The substrate control circuit receives the first and second power supply voltages as power supply, and outputs the higher one of the first and second power supply voltages.

In the second example semiconductor integrated circuit, the second switch control circuit includes an input terminal configured to receive an input signal, an output terminal configured to output an output signal, a first output circuit configured to output a signal ranging from the level of the ground potential to the level of the first power supply voltage according to the input signal, a second output circuit configured to output a signal ranging from the level of the ground potential to the level of the second power supply voltage according to the input signal, a third PMOS transistor configured to connect the first output circuit and the output terminal together, and a fourth PMOS transistor configured to connect the second output circuit and the output terminal together. The gate of the third PMOS transistor receives the second power supply voltage, and the substrate electrode of the third PMOS transistor is connected to the output of the substrate control circuit. The gate of the fourth PMOS transistor receives the first power supply voltage, and the substrate electrode of the fourth PMOS transistor is connected to the output of the substrate control circuit.

A third example semiconductor integrated circuit according to the present disclosure includes a ground terminal configured to receive a ground potential, a first power supply terminal configured to receive a first power supply voltage higher than the ground potential, a second power supply terminal configured to receive a second power supply voltage higher than the ground potential and lower than the first power supply voltage, a third power supply terminal configured to output the first power supply voltage received by the first power supply terminal or the second power supply voltage received by the second power supply terminal, a first PMOS transistor configured to connect the first and third power supply terminals together, a second PMOS transistor configured to connect the third power supply terminal and a first node together, a third PMOS transistor configured to connect the first node and the second power supply terminal together, a first switch control circuit connected to the first PMOS transistor, a second switch control circuit connected to the second PMOS transistor, a third switch control circuit connected to the third PMOS transistor. A substrate electrode of the second PMOS transistor is connected to the first power supply terminal. A substrate electrode of the third PMOS transistor is connected to the second power supply terminal. The first switch control circuit outputs a signal ranging from the level of the ground potential to the level of the first power supply voltage to a gate of the first PMOS transistor, to control the first PMOS transistor so that the first PMOS transistor is on or off. The second switch control circuit outputs a signal ranging from the level of the ground potential to the level of the first power supply voltage to a gate of the second PMOS transistor, to control the second PMOS transistor so that the second PMOS transistor is on or off. The third switch control circuit outputs a signal ranging from the level of the ground potential to the level of the second power supply voltage to a gate of the third PMOS transistor, to control the third PMOS transistor so that the third PMOS transistor is on or off.

According to the present disclosure, in a semiconductor integrated circuit including a power supply switch circuit, even when any of power supply voltages is off, an unwanted current which is due to a parasitic diode, etc., does not occur, and problems, such as a device breakdown, latchup, malfunction, etc., can be prevented or reduced. Also, it is not necessary to take a power supply sequence into consideration, leading to a simpler system. Therefore, design cost and chip area can be reduced, and the cost of peripheral parts, such as a power supply IC, etc., can be reduced.

DETAILED DESCRIPTION

Embodiments will now be described with reference to the accompanying drawings.

In each of the following embodiments, a semiconductor integrated circuit including a power supply switch circuit which switches two power supply voltages, i.e., a power supply voltage VDD1 which is 3.3 V and a power supply voltage VDD2 which is 1.8 V, will be described.

It is assumed that, similar to recent system LSIs, the 3.3-V power supply voltage VDD1 and the 1.8-V power supply voltage VDD2 are connected to LSI pads, and are used as a power supply to operate, for example, an I/O circuit through which a signal is input from and output to the outside of the LSI, while internal circuits, such as a standard cell, etc., are operated using another power supply voltage VDD3 which is 1.2 V.

Here, the power supply switch circuit and surrounding circuits include elements, such as a transistor capable of withstanding a voltage of 3.3 V or 1.8 V, etc., and therefore, are normally controlled using a 3.3-V level or 1.8-V level signal. Note that an input signal for controlling the power supply switch circuit is a 1.2-V level signal which is generated in an internal circuit, and therefore, the 1.2-V level input signal is converted into a 3.3-V level or 1.8-V level output signal using a level shifter, and the 3.3-V level or 1.8-V level output signal is used to control the power supply switch circuit.

Note that if a 3.3-V level signal or a 1.8-V level signal can be directly generated as an input signal for controlling the power supply switch circuit, the level shifter is no longer required, leading to a considerably simple circuit configuration. Moreover, the off state of the 1.2-V power supply voltage VDD3, which needs to be taken into consideration in the level shifter, no longer needs to be taken into consideration.

First Embodiment

Figure 1:
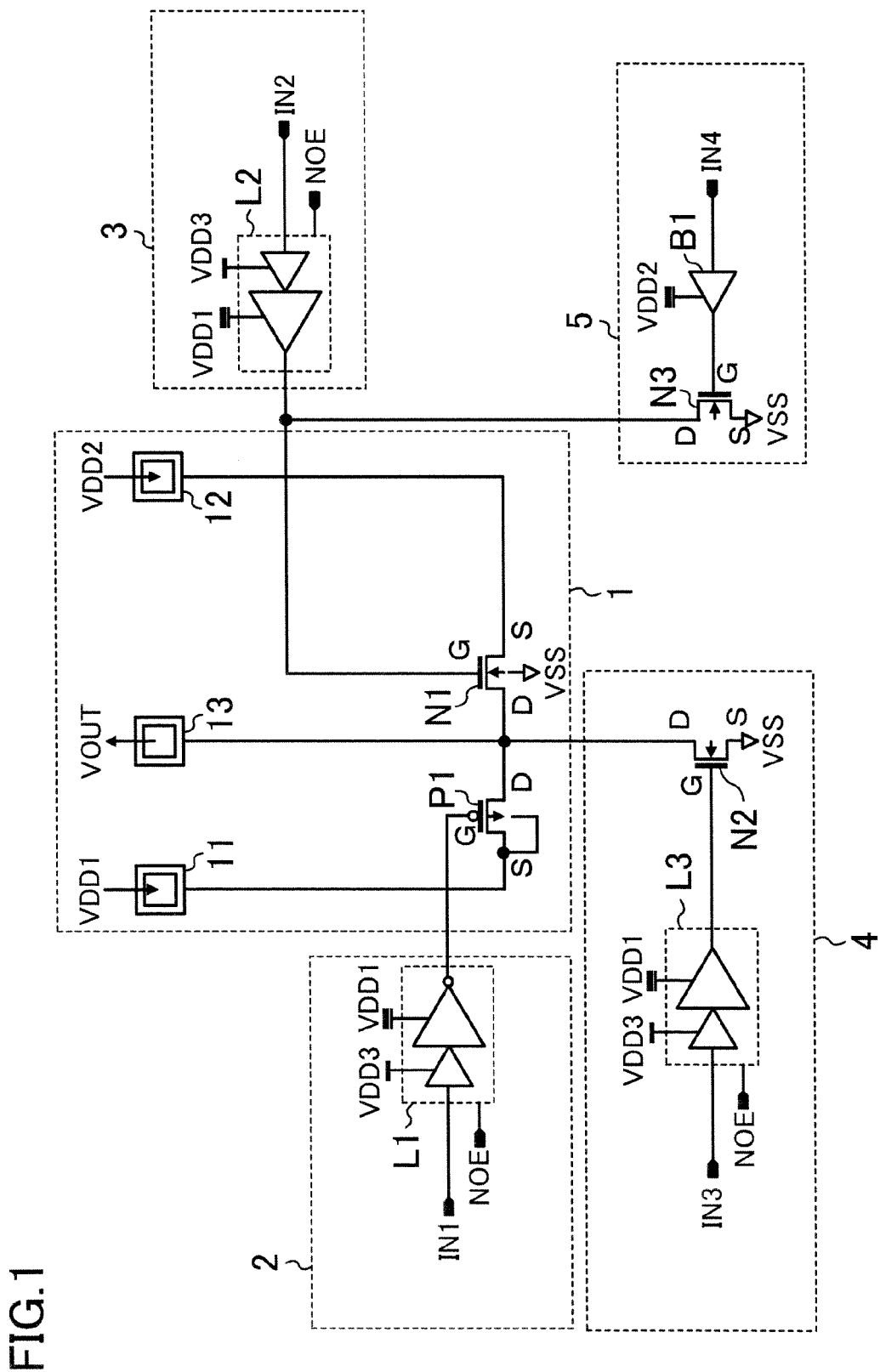
FIG. 1 is a circuit diagram showing a semiconductor integrated circuit according to a first embodiment.

A semiconductor integrated circuit according to a first embodiment will be described with reference to the drawings. FIG. 1 is a circuit diagram showing the semiconductor integrated circuit of the first embodiment. Note that, in the first embodiment and those following, it is assumed that a ground potential VSS is, for example, 0 V, the power supply voltage VDD1 is, for example, 3.3 V, which is higher than the ground potential VSS, the power supply voltage VDD2 is, for example, 1.8 V, which is higher than the ground potential VSS and lower than the power supply voltage VDD1 and the power supply voltage VDD3 is, for example, 1.2 V, which is higher than the ground potential VSS and lower than the power supply voltage VDD2.

The semiconductor integrated circuit includes: a power supply switch circuit 1 which selects the power supply voltage VDD1 applied to a power supply input terminal 11 or the power supply voltage VDD2 applied to a power supply input terminal 12 using a PMOS transistor P1 and an NMOS transistor N1, and outputs the selected voltage as a power supply voltage VOUT to a power supply output terminal 13; a switch control circuit 2 which is connected to the gate of the PMOS transistor P1; a switch control circuit 3 which is connected to the gate of the NMOS transistor N1; a discharge circuit 4 which is connected to the power supply output terminal 13; and a pull-down circuit 5 which is connected to the gate of the NMOS transistor N1.

The power supply switch circuit 1 includes: the PMOS transistor P1 having a source connected to the power supply input terminal 11, a drain connected to the power supply output terminal 13, and a gate connected to the output of the switch control circuit 2; and the NMOS transistor N1 having a source connected to the power supply input ten final 12, a drain connected to the power supply output terminal 13, and a gate connected to the output of the switch control circuit 3. The PMOS transistor P1 has a substrate (well) electrode connected to the power supply input terminal 11, and the NMOS transistor N1 has a substrate (well) electrode connected to a ground terminal to which the ground potential VSS is applied. The PMOS transistor P1 forms a switch portion which is connected in series between the power supply input terminal 11 and the power supply output terminal 13. The NMOS transistor N1 forms a switch portion which is connected in series between the power supply input terminal 12 and the power supply output terminal 13.

The switch control circuit 2, which includes a level shifter L1, outputs a signal ranging from the level of the ground potential VSS to the level of the power supply voltage VDD1 to the gate of the PMOS transistor P1, thereby controlling the PMOS transistor P1 so that the PMOS transistor P1 is on or off. The level shifter L1 receives the power supply voltages VDD3 and VDD1 as power supply. The level shifter L1 converts a signal (VDD3 or VSS) having the level of the power supply voltage VDD3 as an input signal IN1 into a signal (VDD1 or VSS) having the level of the power supply voltage VDD1, and outputs the signal (VDD1 or VSS) to the gate of the PMOS transistor P1. For example, the input signal IN1 having the 1.2-V level is converted into an output signal having the 3.3-V level, which is then output to the gate of the PMOS transistor P1. The level shifter L1 also receives a shutdown signal NOE which does not depend on the power supply states of the power supply voltages VDD1-VDD3. The shutdown signal NOE is, for example, input from the outside of the LSI directly to the level shifter L1 without through a buffer, etc. When the shutdown signal NOE is at the low level (0 V), the level shifter L1 outputs a signal having the opposite logical value of the input signal IN1. On the other hand, when the shutdown signal NOE is at the high level (3.3 V), the level shifter L1 can output a signal whose level is fixed to the high level (VDD1), irrespective of the input signal IN1, even if the power supply voltage VDD3 is off. The level shifter L1 has, for example, a first level shifter circuit configuration shown in FIG. 7.

Figure 7:
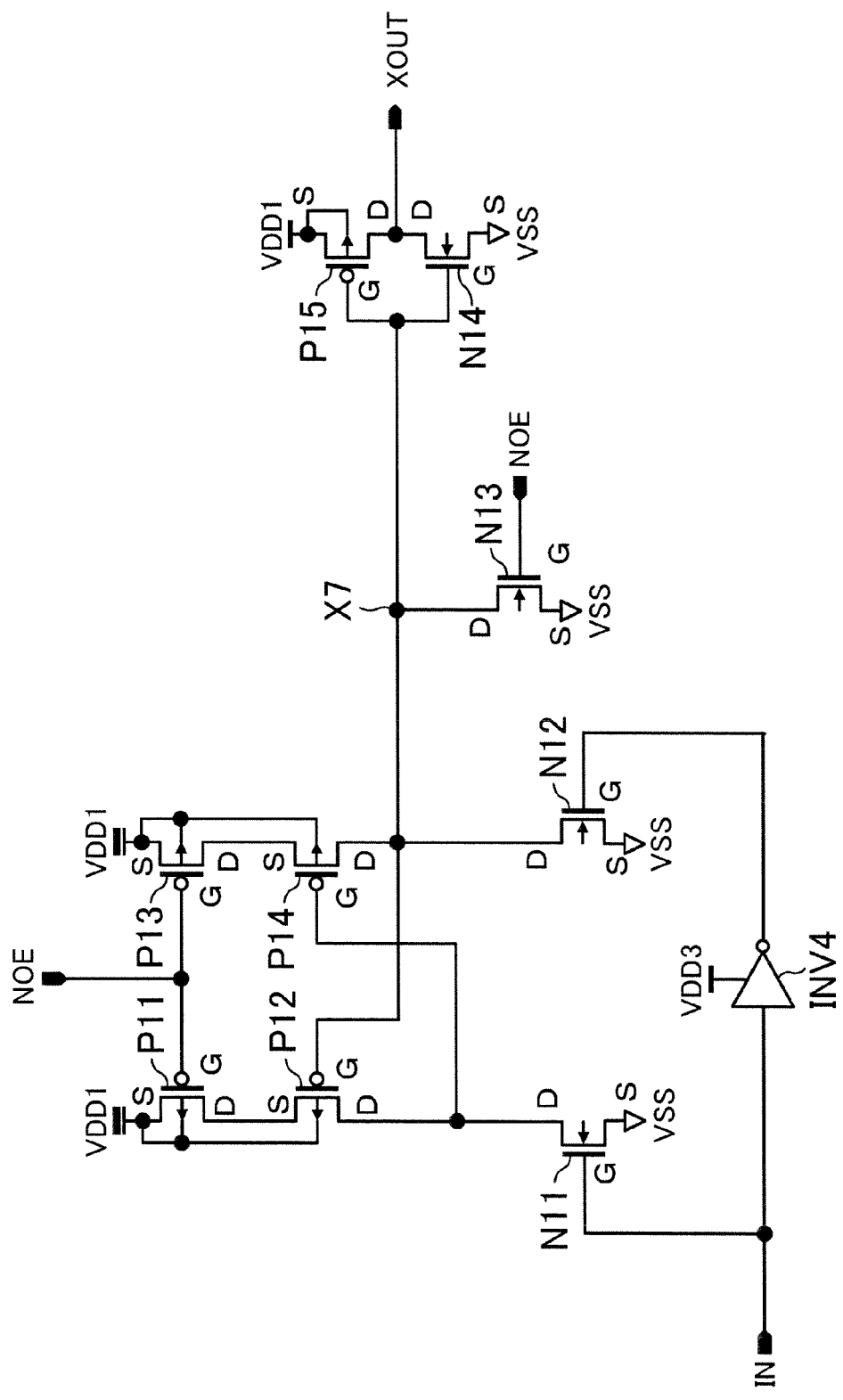
FIG. 7 is a circuit diagram showing a first level shifter circuit configuration used as a level shifter in each embodiment.

Here, the first level shifter circuit configuration of FIG. 7 will be briefly described. FIG. 7 is a circuit diagram showing the first level shifter circuit configuration, which is used as a level shifter in each embodiment.

The first level shifter circuit configuration includes PMOS transistors P11-P15, NMOS transistors N11-N14, and an inverter INV4.

The gate of the PMOS transistor P11 receives the shutdown signal NOE and is connected to the gate of the PMOS transistor P13. The source of the PMOS transistor P11 receives the power supply voltage VDD1. The drain of the PMOS transistor P11 is connected to the source of the PMOS transistor P12. The substrate electrode of the PMOS transistor P11 receives the power supply voltage VDD1.

The gate of the PMOS transistor P12 is connected to the drain of the PMOS transistor P14 and a node X7. The source of the PMOS transistor P12 is connected to the drain of the PMOS transistor P11. The drain of the PMOS transistor P12 is connected to the gate of the PMOS transistor P14 and the drain of the NMOS transistor N11. The substrate electrode of the PMOS transistor P12 receives the power supply voltage VDD1.

The gate of the PMOS transistor P13 receives the shutdown signal NOE and is connected to the gate of the PMOS transistor P11. The source of the PMOS transistor P13 receives the power supply voltage VDD1. The drain of the PMOS transistor P13 is connected to the source of the PMOS transistor P14. The substrate electrode of the PMOS transistor P13 receives the power supply voltage VDD1.

The gate of the PMOS transistor P14 is connected to the drain of the PMOS transistor P12. The source of the PMOS transistor P14 is connected to the drain of the PMOS transistor P13. The drain of the PMOS transistor P14 is connected to the gate of the PMOS transistor P12, the drain of the NMOS transistor N12, and the node X7. The substrate electrode of the PMOS transistor P14 receives the power supply voltage VDD1.

The gate of the PMOS transistor P15 is connected to the gate of the NMOS transistor N14 and the node X7. The source of the PMOS transistor P15 receives the power supply voltage VDD1. The drain of the PMOS transistor P15 is connected to the drain of the NMOS transistor N14 and an output terminal XOUT.

The gate of the NMOS transistor N11 is connected to an input terminal IN and the input of the inverter INV4. The source of the NMOS transistor N11 is connected to a ground terminal (ground potential VSS). The drain of the NMOS transistor N11 is connected to the drain of the PMOS transistor P12 and the gate of the PMOS transistor P14.

The gate of the NMOS transistor N12 is connected to the output of the inverter INV4. The source of the NMOS transistor N12 is connected to a ground terminal (ground potential VSS). The drain of the NMOS transistor N12 is connected to the drain of the PMOS transistor P14, the gate of the PMOS transistor P12, and the node X7.

The gate of the NMOS transistor N13 receives the shutdown signal NOE. The source of the NMOS transistor N13 is connected to a ground terminal (ground potential VSS). The drain of the NMOS transistor N13 is connected to the node X7.

The gate of the NMOS transistor N14 is connected to the gate of the PMOS transistor P15 and the node X7. The source of the NMOS transistor N14 is connected to a ground terminal (ground potential VSS). The drain of the NMOS transistor N14 is connected to the drain of the PMOS transistor P15 and the output terminal XOUT.

The input of the inverter INV4 is connected to the input terminal IN and the gate of the NMOS transistor N11. The output of the inverter INV4 is connected to the gate of the NMOS transistor N12.

In the first level shifter circuit configuration, when the shutdown signal NOE is at the high level (3.3 V), the NMOS transistor N13 is on, so that the node X7 is at the ground potential VSS. As a result, the PMOS transistor P15 is on and the NMOS transistor N14 is off, and therefore, the power supply voltage VDD1 is output to the output terminal XOUT.

The switch control circuit 3 includes a level shifter L2 having a buffer configuration. The switch control circuit 3 outputs a signal ranging from the level of the ground potential VSS to the level of the power supply voltage VDD1 to the gate of the NMOS transistor N1, thereby controlling the NMOS transistor N1 so that the NMOS transistor N1 is on or off. The level shifter L2 receives the power supply voltages VDD3 and VDD1 as power supply. The level shifter L2 converts a signal (VDD3 or VSS) having the level of the power supply voltage VDD3 as an input signal IN2 into a signal (VDD1 or VSS) having the level of the power supply voltage VDD1, and outputs the signal (VDD1 or VSS) to the gate of the NMOS transistor N1. For example, the 1.2-V level input signal IN2 is converted into a 3.3-V level output signal, which is then output to the gate of the NMOS transistor N1. The level shifter L2 also receives a shutdown signal NOE which does not depend on the power supply states of the power supply voltages VDD1-VDD3. The shutdown signal NOE is, for example, input from the outside of the LSI directly to the level shifter L2 without through a buffer, etc. When the shutdown signal NOE is at the low level (0 V), the level shifter L2 outputs a signal having the same logical value of the input signal IN2. On the other hand, when the shutdown signal NOE is at the high level (3.3 V), the level shifter L2 outputs a signal whose level is fixed to the low level (VSS), irrespective of the input signal IN2, even if the power supply voltage VDD3 is off. The level shifter L2 has, for example, a second level shifter circuit configuration shown in FIG. 8.

Figure 8:
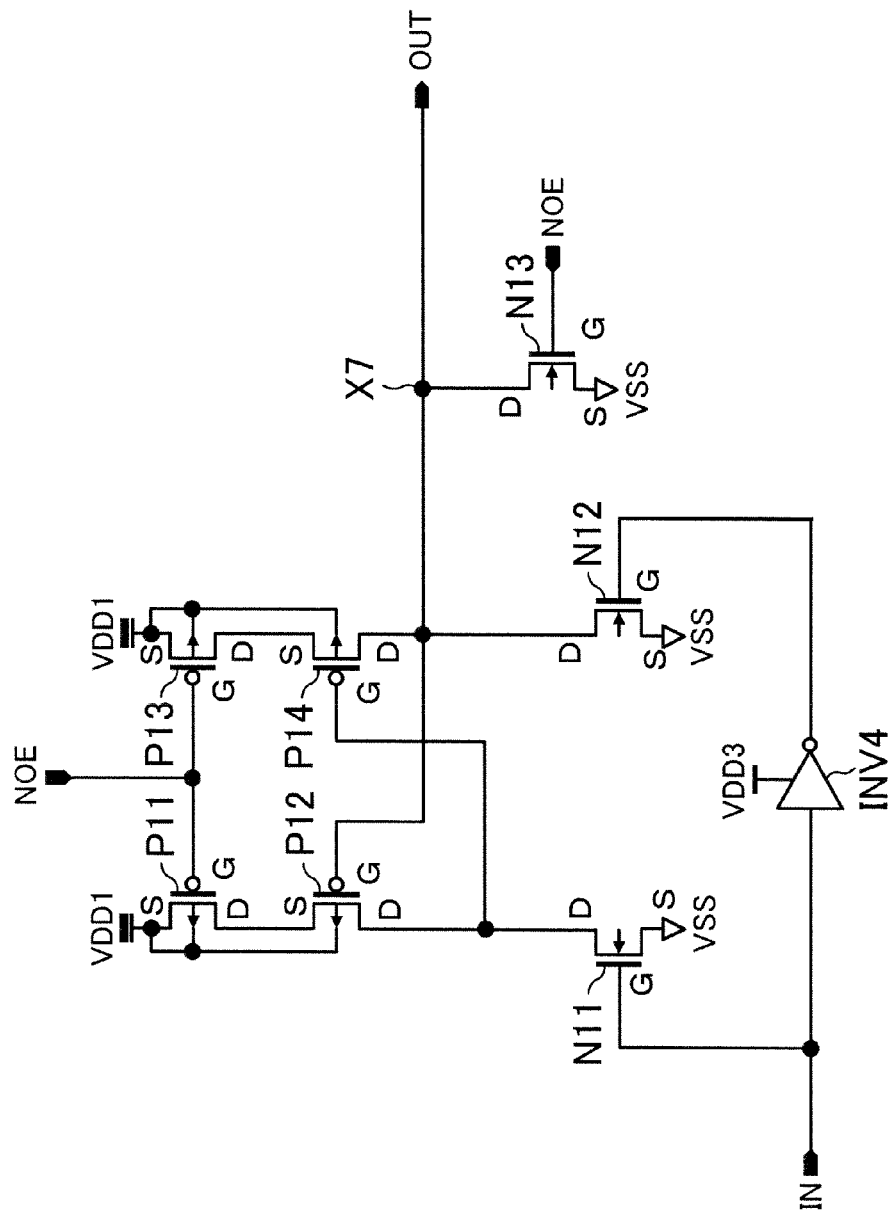
FIG. 8 is a circuit diagram showing a second level shifter circuit configuration used as a level shifter in each embodiment.

Here, the second level shifter circuit configuration of FIG. 8 will be briefly described. FIG. 8 is a circuit diagram showing the second level shifter circuit configuration, which is used as a level shifter in each embodiment.

The second level shifter circuit configuration includes PMOS transistors P11-P14, NMOS transistors N11-N13, and an inverter INV4.

The second level shifter circuit configuration is the same as the first level shifter circuit configuration of FIG. 7, except that the PMOS transistor P15 and the NMOS transistor N14 are removed, and the node X7 is connected to an output terminal OUT.

Therefore, the PMOS transistors P11-P14, the NMOS transistors N11-N13, and the inverter INV4 have the same connections as those in the first level shifter circuit configuration, and therefore, will not here be described.

In the second level shifter circuit configuration, when the shutdown signal NOE is at the high level (3.3 V), the NMOS transistor N13 is on and the node X7 is at the ground potential VSS, and therefore, the ground potential VSS is output to the output terminal OUT.

The discharge circuit 4 includes an NMOS transistor N2 which connects the power supply output terminal 13 with a ground terminal to which the ground potential VSS is applied, and a level shifter L3 having a buffer configuration which is connected to the gate of the NMOS transistor N2. The discharge circuit 4 can discharge electric charge accumulated at the power supply output terminal 13 (VOUT) to reduce the potential, during a transition state in which connection is switched from the power supply input terminal 11 (VDD1) to the power supply input terminal 12 (VDD2), whereby the power supplies can be quickly switched. The drain of the NMOS transistor N2 is connected to the power supply output terminal 13. The source of the NMOS transistor N2 is connected to a ground terminal (ground potential VSS). The gate the NMOS transistor N2 is connected to the output of the level shifter L3. The level shifter L3 receives the power supply voltages VDD3 and VDD1 as power supply. The level shifter L3 converts a signal (VDD3 or VSS) having the level of the power supply voltage VDD3 as an input signal IN3 into a signal (VDD1 or VSS) having the level of the power supply voltage VDD1, and outputs the signal (VDD1 or VSS) to the gate of the NMOS transistor N2. For example, the 1.2-V level input signal IN3 is converted into a 3.3-V level output signal, which is then output to the gate of the NMOS transistor N2. The level shifter L3 also receives a shutdown signal NOE which does not depend on the power supply states of the power supply voltages VDD1-VDD3. The shutdown signal NOE is, for example, input from the outside of the LSI directly to the level shifter L3 without through a buffer, etc. When the shutdown signal NOE is at the low level (0 V), the level shifter L3 outputs a signal having the same logical value of the input signal IN3. On the other hand, when the shutdown signal NOE is at the high level (3.3 V), the level shifter L3 outputs a signal whose level is fixed to the low level (VSS), irrespective of the input signal IN3, even if the power supply voltage VDD3 is off. The level shifter L3 has, for example, a second level shifter circuit configuration shown in FIG. 8.

The pull-down circuit 5 includes an NMOS transistor N3 which connects the gate of the NMOS transistor N1 with a ground terminal to which the ground potential VSS is applied, and a buffer B1 which is connected to the gate of the NMOS transistor N3. The pull-down circuit 5 causes the gate of the NMOS transistor N1 to be off when both of the power supply voltages VDD1 and VDD3 are off and only the power supply voltage VDD2 is on. The NMOS transistor N3 is a pull-down transistor. The drain of the NMOS transistor N3 is connected to the gate of the NMOS transistor N1. The source of the NMOS transistor N3 is connected to a ground terminal (ground potential VSS). The gate of the NMOS transistor N3 is connected to the output of the buffer B1. The buffer B1 receives the power supply voltage VDD2 as power supply. The buffer B1 receives a pull-down control signal (input signal) IN4 as an input, and outputs a signal (VDD2 or VSS) having the level of the power supply voltage VDD2 and the same logical value of the pull-down control signal IN4 as an output signal to the gate of the NMOS transistor N3. This configuration can pull down the gate of the NMOS transistor N1 to the level of the ground potential VSS according to the pull-down control signal IN4. The pull-down control signal IN4 may be either a 3.3-V signal or a 1.8-V signal, and may be the same as the shutdown signal NOE which is used in the level shifters L1-L3. When the pull-down control signal IN4 has a sufficient drive capability, the buffer B1 may be removed and the pull-down control signal IN4 may be input directly to the gate of the NMOS transistor N3.

In the above embodiment, for example, when the power supply input terminal 11 (VDD1) and the power supply input terminal 12 (VDD2) are connected together or the power supply input terminal 11 (VDD1) and a ground terminal (VSS) are connected together through the PMOS transistor P1, the NMOS transistors N1 and N2, etc., an unwanted current flows between the power supplies, leading to a device breakdown, latchup, or malfunction. Therefore, these transistors are normally controlled exclusively from each other.

Specifically, when the PMOS transistor P1 is on, the other transistors, i.e., NMOS transistors N1 and N2, are controlled to be off. When the NMOS transistor N1 is on, the other transistors, i.e., the PMOS transistor P1 and the NMOS transistor N2, are controlled to be off. When the NMOS transistor N2 is on, the other transistors, i.e., the PMOS transistor P1 and the NMOS transistor N1, are controlled to be off.

Next, operation in each power supply state of the semiconductor integrated circuit of the first embodiment will be described.

(When All Power Supplies Are On)

When the power supply voltages VDD1-VDD3 are all on, this is a normal operation state, in which the transistors P1, N1, and N2 are controlled according to the input signals IN1-IN3, respectively, to select one of the power supply voltage VDD1 applied to the power supply input terminal 11 and the power supply voltage VDD2 applied to the power supply input terminal 12, and output the selected voltage as the power supply voltage VOUT to the power supply output terminal 13. At this time, the shutdown signal NOE and the pull-down control signal IN4 are assumed to be at the low level (VSS).

Specifically, when the power supply voltage VDD1 is output as the power supply voltage VOUT, the input signal IN1 is caused to be at the high level (VDD3), and the input signals IN2 and IN3 are caused to be at the low level (VSS), so that the low-level voltage (VSS) is output to the gate of the PMOS transistor P1, and the low-level voltage (VSS) is output to the gates of the NMOS transistors N1 and N2. As a result, the PMOS transistor P1 is controlled to be on, and the NMOS transistors N1 and N2 are controlled to be off, so that the power supply input terminal 11 and the power supply output terminal 13 are electrically connected together by the PMOS transistor P1. As a result, the power supply voltage VDD1 applied to the power supply input terminal 11 is output from the power supply output terminal 13 as the power supply voltage VOUT. At this time, while the power supply voltage VDD1, which is higher than the power supply voltage VDD2, is applied to the drain of the NMOS transistor N1, an unwanted current does not flow to the substrate through the NMOS transistor, unlike PMOS transistors, through which an unwanted current flows to the substrate due to the parasitic diode.

When the power supply voltage VDD2 is output as the power supply voltage VOUT, the input signal IN2 is caused to be at the high level (VDD3), and the input signals IN1 and IN3 are caused to be at the low level (VSS), so that a high-level voltage (VDD1) is output to the gates of the NMOS transistor N1 and the PMOS transistor P1, and the low level (VSS) is output to the gate of the NMOS transistor N2. As a result, the NMOS transistor N1 is controlled to be on, and the PMOS transistor P1 and NMOS transistor N2 are controlled to be off, so that the power supply input terminal 12 and the power supply output terminal 13 are electrically controlled together by the NMOS transistor N1. As a result, the power supply voltage VDD2 applied to the power supply input terminal 12 is output from the power supply output terminal 13 as the power supply voltage VOUT. At this time, the power supply voltage VDD1, which is higher than the power supply voltage VDD2, is applied to the gate of the NMOS transistor N1. Therefore, VDD2<VDD1−Vthn is established, where Vthn represents the threshold voltage of the NMOS transistor N1, and a voltage drop which is due to the NMOS transistor N1 does not occur in the power supply voltage VOUT of the power supply output terminal 13.

(When Any of Power Supplies is Off)

Operation performed when any of the power supply voltages VDD1-VDD3 is off will now be described.

a) First Power Supply State

When the power supply voltage VDD3 is off, the power supply voltage VDD1 is on, and the power supply voltage VDD2 is on, which state is referred to as a first power supply state, the input signals IN1, IN2, and IN3 for controlling the transistors P1, N1, and N2 are unstable. Therefore, the output signals output by the level shifters L1-L3 are controlled according to the shutdown signal NOE provided to the level shifters L1-L3 so that the transistors P1, N1, and N2 are controlled to be off, and therefore, a current does not flow between each electrode. Here, it is assumed that the pull-down control signal IN4 is the same as the shutdown signal NOE.

Specifically, the shutdown signal NOE is caused to be at the high level (3.3 V). As a result, irrespective of the states of the input signals IN1-IN3, the level shifter L1 outputs a high-level voltage (VDD1) to the gate of the PMOS transistor P1, the level shifter L2 outputs the low-level voltage (VSS) to the gate of the NMOS transistor N1, and the level shifter L3 outputs the low-level voltage (VSS) to the gate of the NMOS transistor N2. As a result, the transistors P1, N1, and N2 are off. In this embodiment, the transistors P1, N1, and N2 are all controlled to be off. Alternatively, the configuration of the level shifter may be changed so that the PMOS transistor P1 is on and the NMOS transistors N1 and N2 are off, whereby that the power supply input terminal 11 and the power supply output terminal 13 are electrically connected together, and therefore, the power supply voltage VDD1 can be supplied as the power supply voltage VOUT.

b) Second Power Supply State

When the power supply voltage VDD3 is off, the power supply voltage VDD1 is on, and the power supply voltage VDD2 is off, which state is referred to as a second power supply state, the same operation as that performed in the above first power supply state is performed, and therefore, will here not be described.

c) Third Power Supply State

When the power supply voltage VDD3 is off, the power supply voltage VDD1 is off, and the power supply voltage VDD2 is on, which state is referred to as a third power supply state, the output signals of the level shifters L1-L3 cannot be controlled according to the shutdown signal NOE, and therefore, it is necessary to prevent or reduce the leakage of a current from the power supply voltage VDD2 of the power supply input terminal 12 through the NMOS transistor N1. Therefore, the pull-down control signal IN4 is caused to be at the high level (3.3 V) so that the NMOS transistor N3 of the pull-down circuit 5 is on, whereby the gate of the NMOS transistor N1 is electrically connected to the ground terminal (VSS). As a result, the gate of the NMOS transistor N1 is caused to be at the low level (VSS) so that the NMOS transistor N1 is off. Note that, in this embodiment, the pull-down control signal IN4 is the same as the shutdown signal NOE, and therefore, the shutdown signal NOE is also caused to be at the high level (3.3 V).

d) Fourth Power Supply State

When the power supply voltage VDD3 is on and any of the power supply voltages VDD1 and VDD2 is off, which state is referred to as a fourth power supply state, the same operation as that performed in the above second or third power supply state is performed, and therefore, will not here be described.

As described above, according to this embodiment, a power supply switch circuit can be provided in which an unwanted current which is due to a parasitic diode element, etc., does not occur, even when any of the power supplies is off. The NMOS transistor N1 which has a higher drive capability than that of a PMOS transistor is used as a transistor for supplying the power supply voltage VDD2 of the power supply input terminal 12 to the power supply output terminal 13. Therefore, when the same drive capability is provided, the footprint of the transistor can be caused to be smaller than when a PMOS transistor is used.

Second Embodiment

Figure 2:
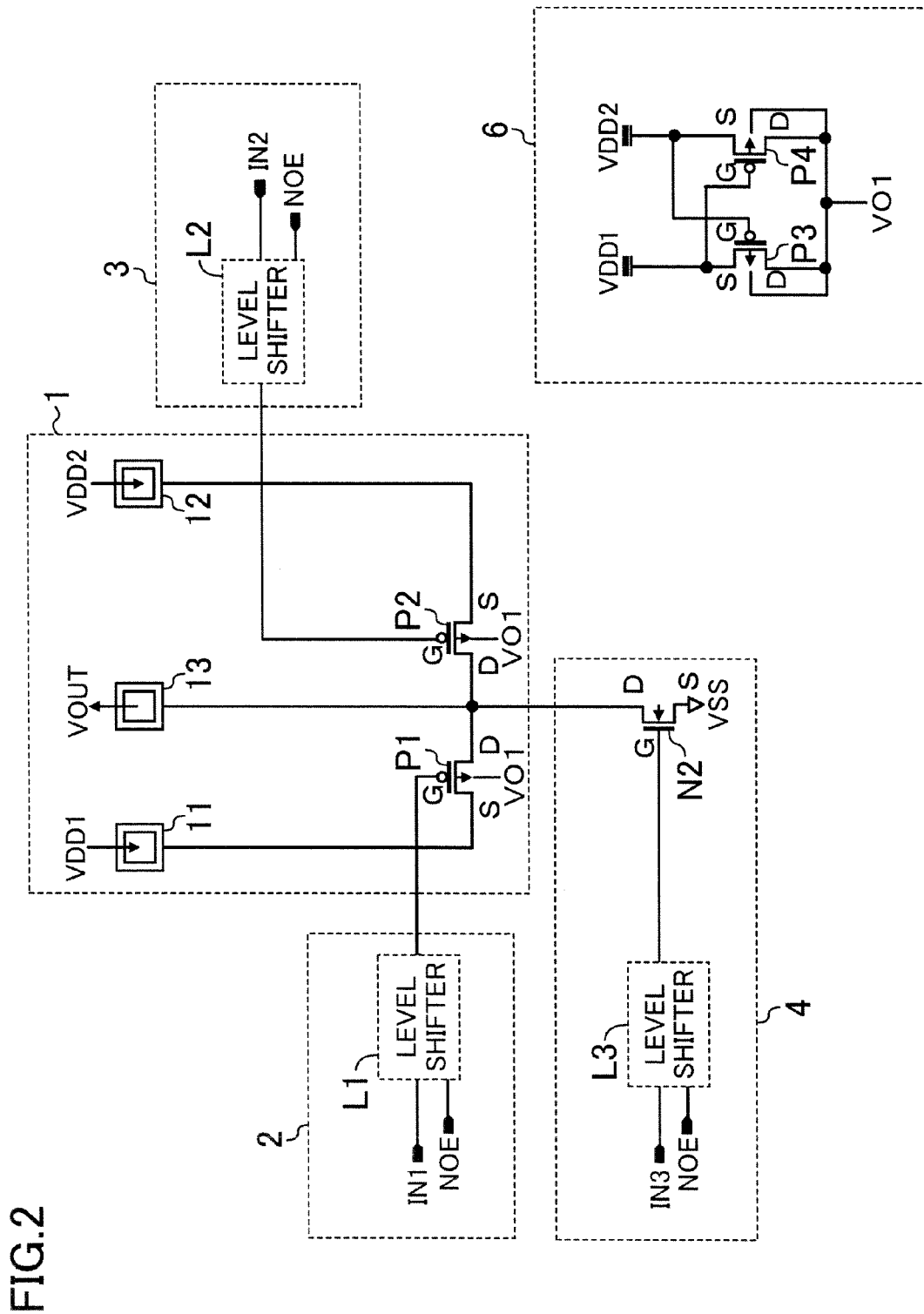
FIG. 2 is a circuit diagram showing a semiconductor integrated circuit according to a second embodiment.

A semiconductor integrated circuit according to a second embodiment will now be described with reference to the drawings. FIG. 2 is a circuit diagram showing the semiconductor integrated circuit of the second embodiment. Note that substantially the same configuration as that of the first embodiment of FIG. 1 may not be redundantly described.

The semiconductor integrated circuit includes: a power supply switch circuit 1 which selects a power supply voltage VDD1 applied to a power supply input terminal 11 or a power supply voltage VDD2 applied to a power supply input terminal 12 using a PMOS transistor P1 and a PMOS transistor P2, and outputs the selected voltage as a power supply voltage VOUT to a power supply output terminal 13; a switch control circuit 2 which is connected to the gate of the PMOS transistor P1; a switch control circuit 3 which is connected to the gate of the PMOS transistor P2; a discharge circuit 4 which is connected to the power supply output terminal 13; and a substrate control circuit 6 which is connected to the substrate (well) electrodes of the PMOS transistors P1 and P2.

The power supply switch circuit 1 includes the PMOS transistor P1 having a source connected to the power supply input terminal 11, a drain connected to the power supply output terminal 13, and a gate connected to the output of the switch control circuit 2, and the PMOS transistor P2 having a source connected to the power supply input terminal 12, a drain connected to the power supply output terminal 13, and a gate connected to the output of the switch control circuit 3. The substrate (well) electrode of the PMOS transistor P1 is connected to the output VO1 of the substrate control circuit 6, and the substrate (well) electrode of the PMOS transistor P2 is connected to the output VO1 of the substrate control circuit 6. The PMOS transistor P1 forms a switch portion which is connected in series between the power supply input terminal 11 and the power supply output terminal 13. The PMOS transistor P2 forms a switch portion which is connected in series between the power supply input terminal 12 and the power supply output terminal 13.

The switch control circuit 2, which includes a level shifter L1 which receives an input signal IN1, outputs a signal having the opposite logical value of the input signal IN1 to the gate of the PMOS transistor P1. The level shifter L1 converts a signal (VDD3 or VSS) having the level of the power supply voltage VDD3 as the input signal IN1 into a signal (VDD1 or VSS) having the level of the power supply voltage VDD1 or a signal (VDD2 or VSS) having the level of the power supply voltage VDD2, and outputs the signal (VDD1 or VSS) or the signal (VDD2 or VSS) to the gate of the PMOS transistor P1. The level shifter L1 also receives a shutdown signal NOE which does not depend on the power supply states of the power supply voltages VDD1-VDD3. The shutdown signal NOE is, for example, input from the outside of the LSI directly to the level shifter L1 without through a buffer, etc. When the shutdown signal NOE is at the low level (0 V), the level shifter L1 outputs a signal having the opposite logical value of the input signal IN1. On the other hand, when the shutdown signal NOE is at the high level (3.3 V), the level shifter L1 outputs a signal whose level is fixed to the high level (VDD1), irrespective of the input signal IN1, even if the power supply voltage VDD3 is off.

The switch control circuit 3, which includes a level shifter L2 which receives an input signal IN2, outputs a signal having the opposite logical value of the input signal IN2 to the gate of the PMOS transistor P2. The level shifter L2 converts a signal (VDD3 or VSS) having the level of the power supply voltage VDD3 as the input signal IN2 into a signal (VDD1 or VSS) having the level of the power supply voltage VDD1 or a signal (VDD2 or VSS) having the level of the power supply voltage VDD2, and outputs the signal (VDD1 or VSS) or the signal (VDD2 or VSS) to the gate of the PMOS transistor P2. The level shifter L2 also receives a shutdown signal NOE which does not depend on the power supply states of the power supply voltages VDD1-VDD3. The shutdown signal NOE is, for example, input from the outside of the LSI directly to the level shifter L2 without through a buffer, etc. When the shutdown signal NOE is at the low level (0 V), the level shifter L2 outputs a signal having the opposite logical value of the input signal IN2. On the other hand, when the shutdown signal NOE is at the high level (3.3 V), the level shifter L2 outputs a signal whose level is fixed to a high level (VDD1 or VDD2), irrespective of the input signal IN2, even when the power supply voltage VDD3 is off.

The discharge circuit 4 includes an NMOS transistor N2 which connects the power supply output terminal 13 with a ground terminal to which the ground potential VSS is applied, and a level shifter L3 which is connected to the gate of the NMOS transistor N2. The discharge circuit 4 can discharge electric charge accumulated at the power supply output terminal 13 (VOUT) to reduce the potential, during a transition state in which connection is switched from the power supply input terminal 11 (VDD1) to the power supply input terminal 12 (VDD2), whereby the power supplies can be quickly switched. The drain of the NMOS transistor N2 is connected to the power supply output terminal 13. The source of the NMOS transistor N2 is connected to a ground terminal (ground potential VSS). The gate the NMOS transistor N2 is connected to the output of the level shifter L3. The level shifter L3 converts a signal (VDD3 or VSS) having the level of the power supply voltage VDD3 as an input signal IN3 into a signal (VDD1 or VSS) having the level of the power supply voltage VDD1 or a signal (VDD2 or VSS) having the level of the power supply voltage VDD2, and outputs the signal (VDD1 or VSS) or the signal (VDD2 or VSS) to the gate of the NMOS transistor N2. The level shifter L3 also receives a shutdown signal NOE which does not depend on the power supply states of the power supply voltages VDD1-VDD3. The shutdown signal NOE is, for example, input from the outside of the LSI directly to the level shifter L3 without through a buffer, etc. When the shutdown signal NOE is at the low level (0 V), the level shifter L3 outputs a signal having the same logical value of the input signal IN3. On the other hand, when the shutdown signal NOE is at the high level (3.3 V), the level shifter L3 outputs a signal whose level is fixed to the low level (VSS), irrespective of the input signal IN3, even if the power supply voltage VDD3 is off.

The substrate control circuit 6 receives the power supply voltages VDD1 and VDD2 as power supply, and outputs the higher one of the power supply voltages VDD1 and VDD2. The substrate control circuit 6 includes a PMOS transistor P3 and a PMOS transistor P4 which are complementarily connected together. The output VO1 of the substrate control circuit 6 is connected to the substrate electrode of the PMOS transistor P1 and the substrate electrode of the PMOS transistor P2. The source of the PMOS transistor P3 receives the power supply voltage VDD1. The drain of the PMOS transistor P3 is connected to the output VO1. The gate of the PMOS transistor P3 receives the power supply voltage VDD2. The substrate (well) electrode of the PMOS transistor P3 is connected to the drain of the PMOS transistor P3 and the output VO1. The source of the PMOS transistor P4 receives the power supply voltage VDD2. The drain of the PMOS transistor P4 is connected to the output VO1. The gate of the PMOS transistor P4 receives the power supply voltage VDD1. The substrate (well) electrode of the PMOS transistor P4 is connected to the drain of the PMOS transistor P4 and the output VO1.

In the above embodiment, for example, when the power supply input terminal 11 (VDD1) and the power supply input terminal 12 (VDD2) are connected together, or the power supply input terminal 11 (VDD1) and a ground terminal (VSS) are connected together, by the PMOS transistor P1 or P2, the NMOS transistor N2, etc., an unwanted current flows between the power supplies, leading to a device breakdown, latchup, or malfunction. Therefore, these transistors are normally controlled exclusively from each other.

Specifically, when the PMOS transistor P1 is on, the other transistors, i.e., the PMOS transistor P2 and the NMOS transistor N2, are controlled to be off. When the PMOS transistor P2 is on, the other transistors, i.e., the PMOS transistor P1 and the NMOS transistor N2, are controlled to be off. When the NMOS transistor N2 is on, the other transistors, i.e., the PMOS transistors P1 and P2, are controlled to be off.

Next, operation in each power supply state of the semiconductor integrated circuit of the second embodiment will be described.

(When All Power Supplies Are On)

When the power supply voltages VDD1-VDD3 are all on, normal operation is performed in which the transistors P1, P2, and N2 are controlled according to the input signals IN1-IN3, respectively, to select one of the power supply voltage VDD1 applied to the power supply input terminal 11 and the power supply voltage VDD2 applied to the power supply input terminal 12, and output the selected power supply voltage as the power supply voltage VOUT to the power supply output terminal 13. At this time, the output VO1 of the substrate control circuit 6 is the power supply voltage VDD1.

Specifically, when the power supply voltage VDD1 is output as the power supply voltage VOUT, the input signal IN1 is caused to be at the high level (VDD3), and the input signals IN2 and IN3 are caused to be at the low level (VSS), so that the low-level voltage (VSS) is output to the gate of the PMOS transistor P1, a high-level voltage (VDD1 or VDD2) is output to the gate of the PMOS transistor P2, and the low-level voltage (VSS) is output to the gate of the NMOS transistor N2. As a result, the PMOS transistor P1 is controlled to be on, and the PMOS transistor P2 and the NMOS transistor N2 are controlled to be off, so that the power supply input terminal 11 and the power supply output terminal 13 are electrically connected together by the PMOS transistor P1. As a result, the power supply voltage VDD1 applied to the power supply input terminal 11 is output from the power supply output terminal 13 as the power supply voltage VOUT. At this time, the power supply voltage VDD1, which is higher than the power supply voltage VDD2, is applied to the drain of the PMOS transistor P2. However, the substrate electrode of the PMOS transistor P2 has the power supply voltage VDD1 due to the output VO1 of the substrate control circuit 6, and therefore, an unwanted current which flows to the substrate due to a parasitic diode can be prevented or reduced.

When the power supply voltage VDD2 is output as the power supply voltage VOUT, the input signal IN2 is caused to be at the high level (VDD3), and the input signals IN1 and IN3 are caused to be at the low level (VSS), so that the low-level voltage (VSS) is output to the gate of the PMOS transistor P2, a high-level voltage (VDD1 or VDD2) is output to the gate of the PMOS transistor P1, and the low-level voltage (VSS) is output to the gate of the NMOS transistor N2. As a result, the PMOS transistor P2 is controlled to be on, and the PMOS transistor P1 and the NMOS transistor N2 are controlled to be off, so that the power supply input terminal 12 and the power supply output terminal 13 are electrically connected together by the PMOS transistor P2. As a result, the power supply voltage VDD2 applied to the power supply input terminal 12 is output from the power supply output terminal 13 as the power supply voltage VOUT.

(When Any of Power Supplies is Off)

Operation performed when any of the power supplies is off will be described using a specific level shifter circuit configuration. Note that, in the following first to third examples, specific circuit configurations of the level shifters L1-L3 in the semiconductor integrated circuit of FIG. 2 are described, and the power supply switch circuit 1 and the substrate control circuit 6 have the same circuit configuration of FIG. 2.

A. First Example

Figure 3:
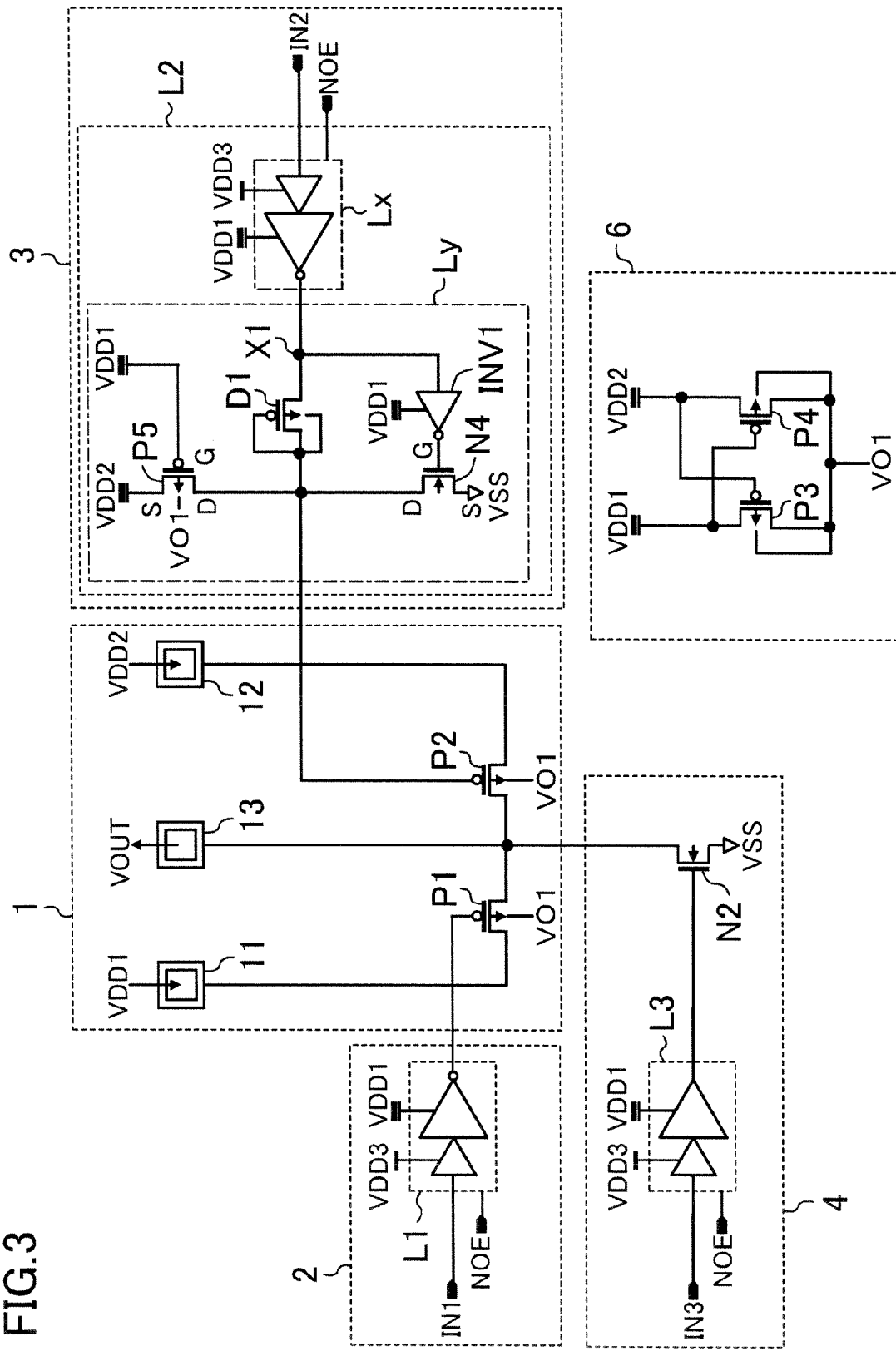
FIG. 3 is a circuit diagram showing a first example of the semiconductor integrated circuit of the second embodiment.

A first example of the semiconductor integrated circuit of the second embodiment will now be described with reference to the drawings. FIG. 3 is a circuit diagram showing the first example of the semiconductor integrated circuit of the second embodiment. Note that substantially the same configuration as that of FIGS. 1 and 2 may not be redundantly described.

The switch control circuit 2 of FIG. 3 has the same configuration as that of the switch control circuit 2 of FIG. 1. The level shifter L1 has the first level shifter circuit configuration of FIG. 7.

The discharge circuit 4 of FIG. 3 has the same configuration as that of the discharge circuit 4 of FIG. 1. The level shifter L3 has the second level shifter circuit configuration of FIG. 8.

The switch control circuit 3 of FIG. 3 includes a level shifter L2 including a level shifter unit (output circuit) Lx and an output control unit Ly. The level shifter unit Lx has the first level shifter circuit configuration of FIG. 7.

The level shifter unit Lx receives the input signal IN2, and outputs a signal having the opposite logical value of the input signal IN2 to a node X1 of the output control unit Ly. The level shifter unit Lx converts a signal (VDD3 or VSS) having the level of the power supply voltage VDD3 as the input signal IN2 into a signal (VDD1 or VSS) having the level of the power supply voltage VDD1, and outputs the signal (VDD1 or VSS) to the node X1 of the output control unit Ly. The level shifter unit Lx also receives a shutdown signal NOE which does not depend on the power supply states of the power supply voltages VDD1-VDD3.

The output control unit Ly outputs a high-level voltage (VDD2) when the power supply voltage VDD1 is off and the power supply voltage VDD2 is on. The input (node X1) of the output control unit Ly is connected to the output of the level shifter unit Lx. The output of the output control unit Ly is connected to the gate of the PMOS transistor P2.

The output control unit Ly includes a PMOS transistor P5 which serves as a pull-up transistor, an NMOS transistor N4 which serves as a pull-down transistor, a diode D1 including a PMOS transistor, and an inverter INV1. The gate of the PMOS transistor P5 is connected to the power supply voltage VDD1. The source of the PMOS transistor P5 is connected to the power supply voltage VDD2. The drain of the PMOS transistor P5 is connected to the gate of the PMOS transistor P2. The substrate (well) electrode of the PMOS transistor P5 is connected to the output VO1 of the substrate control circuit 6. The gate of the NMOS transistor N4 is connected to the output of the inverter INV1. The source of the NMOS transistor N4 is connected to a ground terminal (ground potential VSS). The drain of the NMOS transistor N4 is connected to the gate of the PMOS transistor P2. One end of the diode D1 is connected to the node X1, while the other end of the diode D1 is connected to the gate of the PMOS transistor P2. To the other end of the diode D1, the gate and substrate (well) electrode of a PMOS transistor included in the diode D1, the drain of the PMOS transistor P5, and the drain of the NMOS transistor N4 are connected. The inverter INV1 receives the power supply voltage VDD1 as power supply. The input of the inverter INV1 is connected to the output (node X1) of the level shifter unit Lx. The output of the inverter INV1 is connected to the gate of the NMOS transistor N4. The inverter INV1 provides a signal which is the inverted version of the output of the level shifter unit Lx to the gate of the NMOS transistor N4.

Next, circuit operation of the switch control circuit 3 of this example will be described. Note that circuit operation of the switch control circuit 2 and the discharge circuit 4 is the same as that of the first embodiment of FIG. 1, and therefore, will not here be described. Circuit operation of the power supply switch circuit 1 and the substrate control circuit 6 is the same as that of the second embodiment of FIG. 2, and therefore, will not here be described.

When the input signal IN2 is at the low level (VSS), the node X1 is at the high level (VDD1), and therefore, the high-level voltage (VDD1) is output to the gate of the PMOS transistor P2 through the diode D1. At this time, the inverter INV1 outputs the low-level voltage (VSS) to the gate of the NMOS transistor N4, so that the NMOS transistor N4 is off. The power supply voltage VDD1 is also applied to the gate and substrate electrode of the PMOS transistor P5, so that the PMOS transistor P5 is off.

When the input signal IN2 is at the high level (VDD3), the node X1 is at the low level (VSS). At this time, the inverter INV1 outputs a high-level voltage (VDD1) to the gate of the NMOS transistor N4, so that the NMOS transistor N4 is on, and therefore, the low-level voltage (VSS) is output to the gate of the PMOS transistor P2. The power supply voltage VDD1 is also applied to the gate and substrate electrode of the PMOS transistor P5, so that the PMOS transistor P5 is off.

The substrate (well) electrode of the PMOS transistor P2 receives the power supply voltage VDD1 which is the output VO1 of the substrate control circuit 6, and therefore, the PMOS transistor P2 can be controlled to be on or off according to the output signal having the level of the power supply voltage VDD1 from the level shifter L2.

Circuit operation performed when the power supply voltages VDD1-VDD3 are all on will not here be described, because it is similar to that of the configuration of FIG. 2. In other words, that circuit operation is the same as that described in "When all power supplies are on" related to the configuration of FIG. 2.

Circuit operation performed when any of the power supply voltages VDD1-VDD3 is off will now be described.

a) First Power Supply State

When the power supply voltage VDD3 is off, the power supply voltage VDD1 is on, and the power supply voltage VDD2 is on, which state is referred to as a first power supply state, the input signals IN1, IN2, and IN3 for controlling the transistors P1, P2, and N2 are unstable. Therefore, as in the first embodiment, the output signals output by the level shifters L1-L3 are controlled according to the shutdown signal NOE provided to the level shifters L1-L3 so that the transistors P1, P2, and N2 are controlled to be off, and therefore, a current does not flow between each electrode. At this time, the output VO1 of the substrate control circuit 6 is the power supply voltage VDD1.

Specifically, the shutdown signal NOE is caused to be at the high level (3.3 V). As a result, irrespective of the states of the input signals IN1-IN3, the level shifter L1 outputs a high-level voltage (VDD1) to the gate of the PMOS transistor P1, the level shifter L2 outputs a high-level voltage (VDD1) to the gate of the PMOS transistor P2, and the level shifter L3 outputs the low-level voltage (VSS) to the gate of the NMOS transistor N2. Here, in the level shifter L2, the high-level voltage (VDD1) output from level shifter unit Lx is output to the gate of the PMOS transistor P2 through the diode D1 of the output control unit Ly. As a result, the transistors P1, P2, and N2 are off. In this example, the transistors P1, P2, and N2 are controlled to be off. Alternatively, the configuration of the level shifter may be changed so that the PMOS transistor P1 is on and the PMOS transistor P2 and the NMOS transistor N2 are off, whereby the power supply input terminal 11 and the power supply output terminal 13 are electrically connected together, and therefore, the power supply voltage VDD1 can be supplied as the power supply voltage VOUT.

b) Second Power Supply State

When the power supply voltage VDD3 is off, the power supply voltage VDD1 is on, and the power supply voltage VDD2 is off, which state is referred to as a second power supply state, the same operation as that performed in the above first power supply state is performed, and therefore, will here not be described.

c) Third Power Supply State

When the power supply voltage VDD3 is off, the power supply voltage VDD1 is off, and the power supply voltage VDD2 is on, which state is referred to as a third power supply state, the output signals of the level shifters L1-L3 cannot be controlled according to the shutdown signal NOE, and therefore, it is necessary to prevent or reduce the leakage of a current from the power supply voltage VDD2 of the power supply input terminal 12 through the PMOS transistor P2. Therefore, the output signal of the level shifter L2 is controlled using the output control unit Ly of the level shifter L2 so that the PMOS transistor P2 is off. Specifically, the power supply voltage VDD2 which is the output VO1 of the substrate control circuit 6 is supplied to the substrate electrode of the PMOS transistor P5, so that the power supply voltage VDD1 connected to the gate of the PMOS transistor P5 is off, and therefore, the PMOS transistor P5 is on. As a result, the level shifter L2 outputs a high-level voltage (VDD2) to the gate of the PMOS transistor P2, so that the PMOS transistor P2 is off. Therefore, a current does not flow from the power supply voltage VDD2 of the power supply input terminal 12 through the PMOS transistor P2.

Here, the node X1 is connected to the drain of the PMOS transistor P15 in the first level shifter circuit configuration of FIG. 7. Although there is a parasitic diode between the node X1 and the power supply voltage VDD1 connected to the substrate (well) electrode of the PMOS transistor P15, an unwanted current which is due to the parasitic diode does not flow, because the diode D1 is provided between the node X1 and the output (drain) of the PMOS transistor P5.

d) Fourth Power Supply State

When the power supply voltage VDD3 is on and any of the power supply voltages VDD1 and VDD2 is off, which state is referred to as a fourth power supply state, the same operation as that performed in the above second or third power supply state is performed, and therefore, will here not be described.

As described above, according to this example, a power supply switch circuit can be provided in which even when any of the power supplies is off, an unwanted current which is due to a parasitic diode element, etc., does not occur. When any of the power supply voltages VDD1 and VDD2 is on, the output VO1 from the substrate control circuit 6 can be used to fix the potentials of the substrate electrodes of the PMOS transistors P1 and P2, whereby the resistance to latchup can be increased.

B. Second Example

Figure 4:
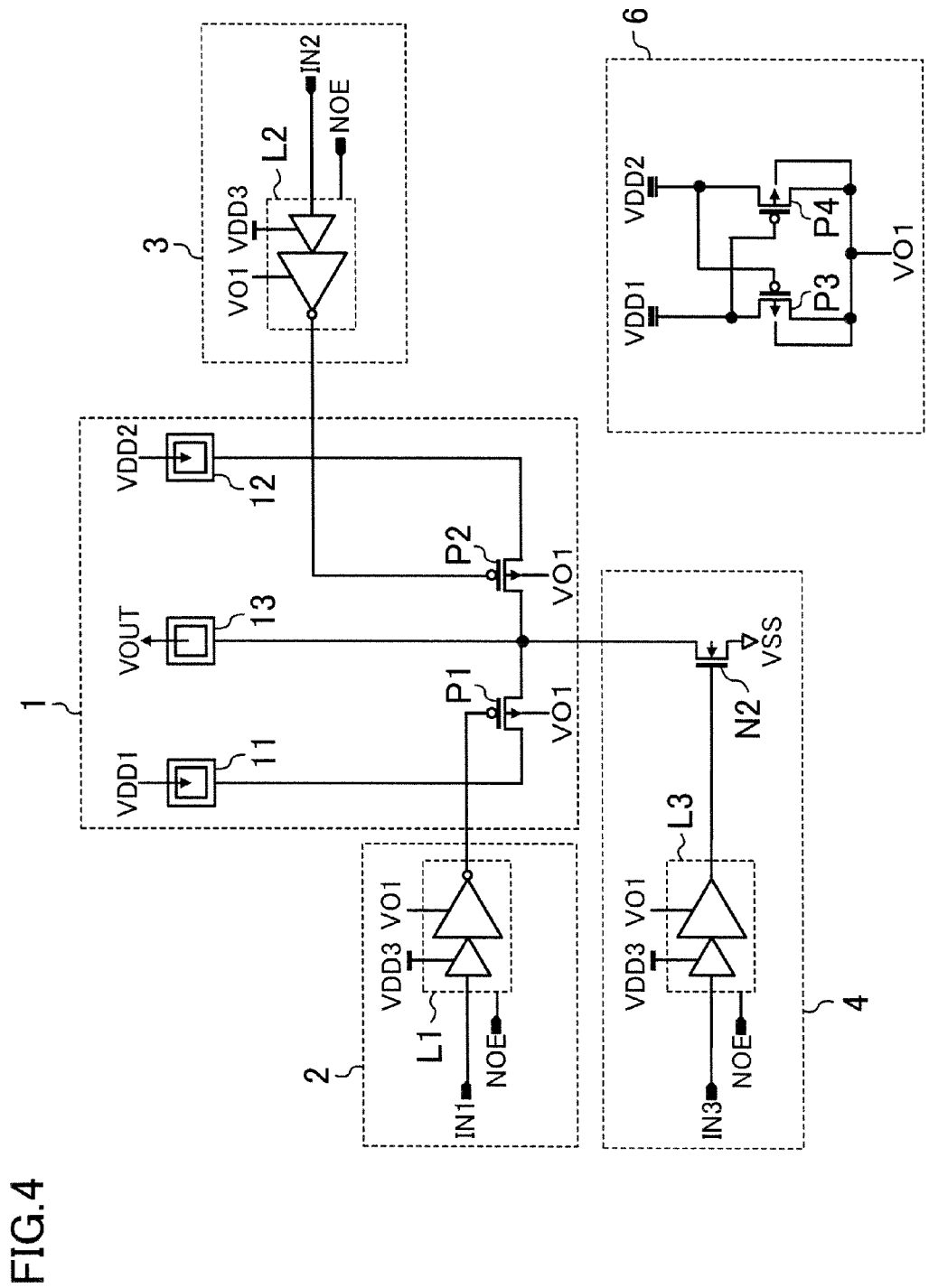
FIG. 4 is a circuit diagram showing a second example of the semiconductor integrated circuit of the second embodiment.

A second example of the semiconductor integrated circuit of the second embodiment will now be described with reference to the drawings. FIG. 4 is a circuit diagram showing the second example of the semiconductor integrated circuit of the second embodiment. Note that substantially the same configuration as that of FIGS. 1 and 2 may not be redundantly described.

The switch control circuit 2 of FIG. 4 has the same configuration as that of the switch control circuit 2 of FIG. 1, and the level shifter L1 has the first level shifter circuit configuration of FIG. 7.

The switch control circuit 3 of FIG. 4 has the same configuration as that of the switch control circuit 2, and the level shifter L2 has the first level shifter circuit configuration of FIG. 7.

The discharge circuit 4 of FIG. 4 has the same configuration as that of the discharge circuit 4 of FIG. 1, and the level shifter L3 has the second level shifter circuit configuration of FIG. 8.

Note that the level shifters L1-L3 of this example have the first level shifter circuit configuration of FIG. 7 and the second level shifter circuit configuration of FIG. 8 in which the output VO1 of the substrate control circuit 6 is connected to a terminal to which the power supply voltage VDD1 is supplied, i.e., the output VO1 (VDD1 or VDD2) of the substrate control circuit 6 is provided as power supply instead of the power supply voltage VDD1.

When the power supply voltages VDD1-VDD3 are all on, circuit operation similar to that of the configuration of FIG. 2 is performed, and therefore, will not here be described. In other words, the same circuit operation as that described in "When all power supplies are on" related to the configuration of FIG. 2 is performed. At this time, the output VO1 of the substrate control circuit 6 has the power supply voltage VDD1, and therefore, the level shifters L1-L3 serve as a level shifter for converting a signal having the level of VDD3 into a signal having the level of VDD1.

Circuit operation performed when any of the power supply voltages VDD1-VDD3 is off will now be described.

a) First Power Supply State

When the power supply voltage VDD3 is off, the power supply voltage VDD1 is on, and the power supply voltage VDD2 is on, which state is referred to as a first power supply state, the output VO1 of the substrate control circuit 6 has the power supply voltage VDD1. In this case, the input signals IN1, IN2, and IN3 for controlling the transistors P1, P2, and N2 are unstable. Therefore, as in the first embodiment, the output signals output by the level shifters L1-L3 are controlled according to the shutdown signal NOE provided to the level shifters L1-L3 so that the transistors P1, P2, and N2 are controlled to be off, and therefore, a current does not flow between each electrode.

Specifically, the shutdown signal NOE is caused to be at the high level (3.3 V). As a result, irrespective of the states of the input signals IN1-IN3, the level shifter L1 outputs a high-level voltage (VDD1) to the gate of the PMOS transistor P1, the level shifter L2 outputs a high-level voltage (VDD1) to the gate of the PMOS transistor P2, and the level shifter L3 outputs the low-level voltage (VSS) to the gate of the NMOS transistor N2. As a result, the transistors P1, P2, and N2 are off. In this embodiment, the transistors P1, P2, and N2 are all controlled to be off. Alternatively, the configuration of the level shifter may be changed so that the PMOS transistor P1 is on and the PMOS transistor P2 and the NMOS transistor N2 are off, whereby the power supply input terminal 11 and the power supply output terminal 13 are electrically connected together, and therefore, the power supply voltage VDD1 can be supplied as the power supply voltage VOUT.

b) Second Power Supply State

When the power supply voltage VDD3 is off, the power supply voltage VDD1 is on, and the power supply voltage VDD2 is off, which state is referred to as a second power supply state, the same operation as that performed in the above first power supply state is performed, and therefore, will here not be described.

c) Third Power Supply State

When the power supply voltage VDD3 is off, the power supply voltage VDD1 is off, and the power supply voltage VDD2 is on, which state is referred to as a third power supply state, the output VO1 of the substrate control circuit 6 is the power supply voltage VDD2, and therefore, the level shifters L1-L3 serve as a level shifter for converting a signal having the level of VDD3 into a signal having the level of VDD2.

The power supply voltage VDD2 which is the output VO1 of the substrate control circuit 6 is supplied to the substrate electrodes of the PMOS transistors P1 and P2, and therefore, the PMOS transistors P1 and P2 can be controlled to be on or off according to an output signal having the level of VDD2 of the level shifters L1 and L2.

Similarly, the NMOS transistor N2 can also be similarly controlled to be on or off according to an output signal having the level of VDD2 of the level shifter L3.

When at least the PMOS transistor P2 is off, a current does not flow from the power supply voltage VDD2 of the power supply input terminal 12 through the PMOS transistor P2.

Also, if the PMOS transistor P1 and the NMOS transistor N2 are off and the PMOS transistor P2 is on, the power supply input terminal 12 and the power supply output terminal 13 can be electrically connected together so that the power supply voltage VDD2 is supplied as the power supply voltage VOUT.

d) Fourth Power Supply State

When the power supply voltage VDD3 is on and any of the power supply voltages VDD1 and VDD2 is off, which state is referred to as a fourth power supply state, the same operation as that performed in the above second or third power supply state is performed, and therefore, will here not be described.

As described above, according to this example, a power supply switch circuit can be provided in which even when any of the power supplies is off, an unwanted current which is due to a parasitic diode element, etc., does not occur. When any of the power supply voltages VDD1 and VDD2 is on, all of the transistors P1, P2, and N2 can be controlled, and therefore, the power supply voltage VOUT output from the power supply output terminal 13 can be arbitrarily controlled, leading to a wider variety of applications.

In actual design, the output VO1 of the substrate control circuit 6 is reduced due to the operating current of the level shifter. Therefore, it is necessary to increase the output capability of the substrate control circuit 6, taking that reduction into consideration. Also, in order to prevent or reduce the propagation of noise caused by the operating current of the level shifter to the substrate electrodes of the PMOS transistors P1 and P2, a plurality of substrate control circuits may be provided, and separate substrate control circuits may be provided in the level shifter and the PMOS transistors P1 and P2.

C. Third Example

Figure 5:
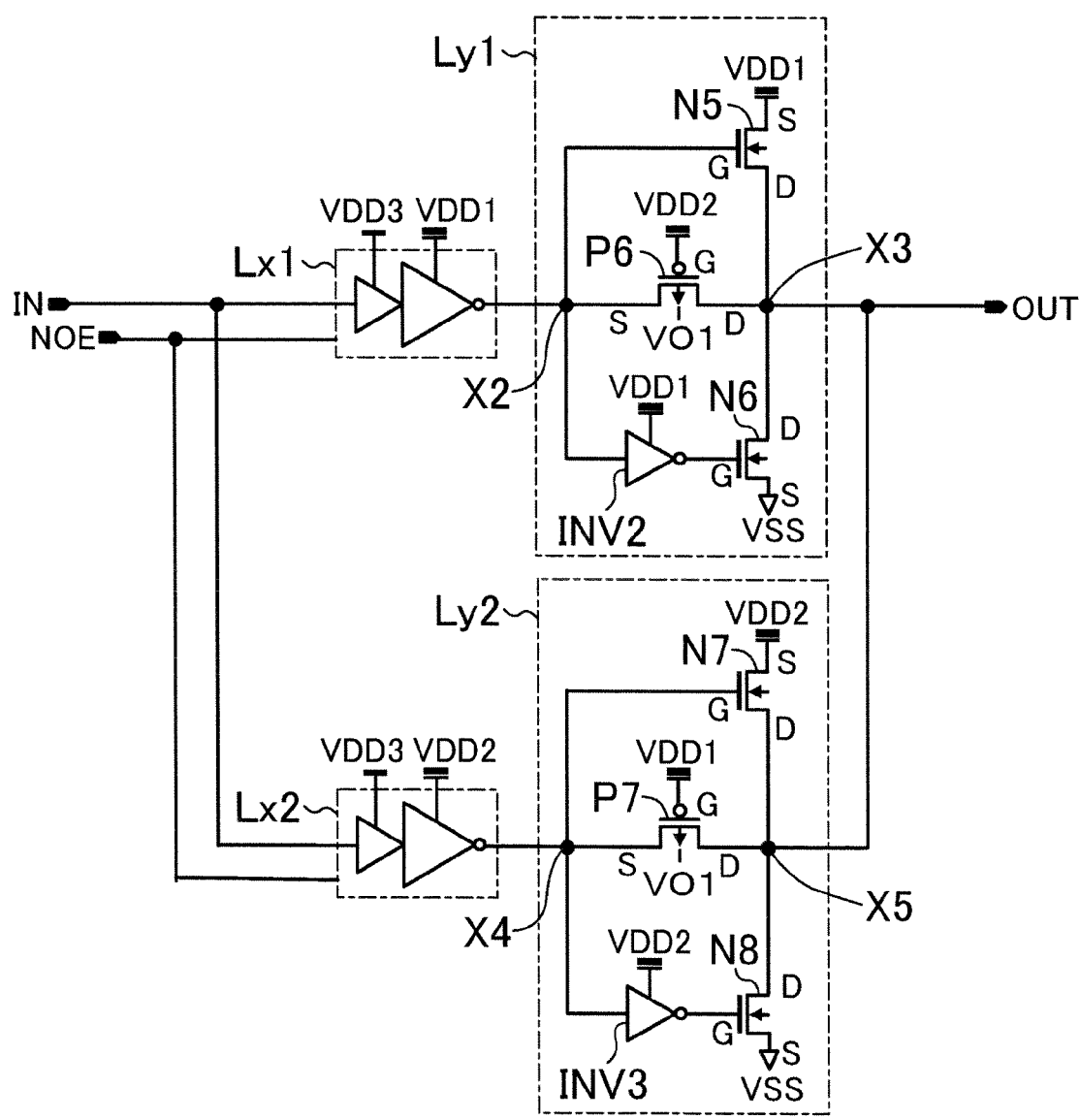
FIG. 5 is a circuit diagram showing a third level shifter circuit configuration used in a third example of the semiconductor integrated circuit of the second embodiment.

A third example of the semiconductor integrated circuit of the second embodiment will now be described with reference to the drawings. FIG. 5 is a circuit diagram showing a third level shifter circuit configuration used in the third example of the semiconductor integrated circuit of the second embodiment. Note that the entire configuration of the semiconductor integrated circuit of the third example has the circuit configuration of FIG. 2.

In the third example, the level shifters L1 and L2 of FIG. 2 have the third level shifter circuit configuration of FIG. 5. The third level shifter circuit configuration includes a first circuit including a level shifter unit Lx1 and an output control unit Ly1, and a second circuit including a level shifter unit Lx2 and an output control unit Ly2. The level shifter units Lx1 and Lx2 have the first level shifter circuit configuration of FIG. 7. Note that the level shifter unit Lx2 has the first level shifter circuit configuration of FIG. 7 in which the power supply voltage VDD1 is replaced with the power supply voltage VDD2. The level shifter L3 of FIG. 2 has a fourth level shifter circuit configuration. The fourth level shifter circuit configuration is the circuit configuration of FIG. 5 in which the output control units Ly1 and Ly2 have the same circuits, and the level shifter units Lx1 and Lx2 have the second level shifter circuit configuration of FIG. 8 instead of the first level shifter circuit configuration of FIG. 7. Note that the level shifter unit Lx2 in the fourth level shifter circuit configuration has the second level shifter circuit configuration of FIG. 8 in which the power supply voltage VDD1 is replaced with the power supply voltage VDD2.

The third level shifter circuit configuration of FIG. 5 will now be described.

The level shifter unit Lx1 receives an input signal IN, and outputs a signal having the opposite logical value of the input signal IN to a node X2 of the output control unit Ly1. The level shifter unit Lx1 converts a signal (VDD3 or VSS) having the level of the power supply voltage VDD3 as the input signal IN into a signal (VDD1 or VSS) having the level of the power supply voltage VDD1, and outputs the signal (VDD1 or VSS) to the node X2. The level shifter unit Lx1 also receives a shutdown signal NOE which does not depend on the power supply states of the power supply voltages VDD1-VDD3.

The output control unit Ly1 includes an NMOS transistor N5 serving as a pull-up transistor, an NMOS transistor N6 serving as a pull-down transistor, a PMOS transistor P6, and an inverter INV2. The gate of the NMOS transistor N5 is connected to the output (node X2) of the level shifter unit Lx1. The source of the NMOS transistor N5 is connected to the power supply voltage VDD1. The drain of the NMOS transistor N5 is connected to an output terminal OUT (node X3). The gate of the NMOS transistor N6 is connected to the output of the inverter INV2. The drain of the NMOS transistor N6 is connected to the output terminal OUT (node X3). The source of the NMOS transistor N6 is connected to a ground terminal (ground potential VSS). The gate of the PMOS transistor P6 is connected to the power supply voltage VDD2. The source of the PMOS transistor P6 is connected to the output (node X2) of the level shifter unit Lx1. The drain of the PMOS transistor P6 is connected to the output terminal OUT (node X3). The substrate (well) electrode of the PMOS transistor P6 is connected to the output VO1 of the substrate control circuit 6. The inverter INV2 receives the power supply voltage VDD1 as power supply. The input of the inverter INV2 is connected to the output (node X2) of the level shifter unit Lx1. The output of the inverter INV2 is connected to the gate of the NMOS transistor N6. The inverter INV2 provides a signal which is the inverted version of the output (node X2) of the level shifter unit Lx1 to the gate of the NMOS transistor N6.

The level shifter unit Lx2 receives the input signal IN, and outputs a signal having the opposite logical value of the input signal IN to a node X4 of the output control unit Ly2. The level shifter unit Lx2 converts a signal (VDD3 or VSS) having the level of the power supply voltage VDD3 as the input signal IN into a signal (VDD2 or VSS) having the level of the power supply voltage VDD2, and outputs the signal (VDD2 or VSS) to the node X4. The level shifter unit Lx2 also receives a shutdown signal NOE which does not depend on the power supply states of the power supply voltages VDD1-VDD3.

The output control unit Ly2 includes an NMOS transistor N7 serving as a pull-up transistor, an NMOS transistor N8 serving as a pull-down transistor, a PMOS transistor P7, and an inverter INV3. The gate of the NMOS transistor N7 is connected to the output (node X4) of the level shifter unit Lx2. The source of the NMOS transistor N7 receives the power supply voltage VDD2. The drain of the NMOS transistor N7 is connected to an output terminal OUT (node X5). The gate of the NMOS transistor N8 is connected to the output of the inverter INV3. The drain of the NMOS transistor N8 is connected to the output terminal OUT (node X5). The source of the NMOS transistor N8 is connected to a ground terminal (ground potential VSS). The gate of the PMOS transistor P7 receives the power supply voltage VDD1. The source of the PMOS transistor P7 is connected to the output (node X4) of the level shifter unit Lx2. The drain of the PMOS transistor P7 is connected to the output terminal OUT (node X5). The substrate (well) electrode of the PMOS transistor P7 is connected to the output VO1 of the substrate control circuit 6. The inverter INV3 receives the power supply voltage VDD2 as power supply. The input of the inverter INV3 is connected to the output (node X4) of the level shifter unit Lx2. The output of the inverter INV3 is connected to the gate of the NMOS transistor N8. The inverter INV3 provides a signal having the inverted version of the output (node X4) of the level shifter unit Lx2 to the gate of the NMOS transistor N8.

Firstly, circuit operation of each component of the third level shifter circuit configuration of FIG. 5 will be described.

The level shifter unit Lx1 converts a signal having the level of VDD3 into a signal having the level of VDD1 and has the first level shifter circuit configuration of FIG. 7.

The level shifter unit Lx2 converts a signal having the level of VDD3 into a signal having the level of VDD2, and has the first level shifter circuit configuration of FIG. 7 in which the power supply voltage VDD1 is replaced with the power supply voltage VDD2.

Here, operation of the PMOS transistor P6 will be described. The output of the level shifter unit Lx1 is connected to the output terminal OUT through the PMOS transistor P6.

When both of the power supply voltages VDD1 and VDD2 are on, the PMOS transistor P6 receives the power supply voltage VDD1 which is the output VO1 of the substrate control circuit 6 at the substrate electrode thereof, and the power supply voltage VDD2 at the gate thereof, so that the PMOS transistor P6 is on, and therefore, outputs the output of the level shifter unit Lx1 to the output terminal OUT.

When the power supply voltage VDD1 is off and the power supply voltage VDD2 is on, the PMOS transistor P6 receives the power supply voltage VDD2 which is the output VO1 of the substrate control circuit 6 at the substrate electrode thereof, and the power supply voltage VDD2 at the gate thereof, so that the PMOS transistor P6 is off, and therefore, the connection between the output of the level shifter unit Lx1 and the output terminal OUT is disconnected. Note that, at this time, the output of the level shifter unit Lx1 is unstable because the power supply voltage VDD1 as power supply is off.

When the power supply voltage VDD1 is on and the power supply voltage VDD2 is off, the PMOS transistor P6 receives the power supply voltage VDD1 which is the output VO1 of the substrate control circuit 6 at the substrate electrode thereof, and the power supply voltage VDD2 received at the gate thereof is off, so that the PMOS transistor P6 is on, and therefore, outputs the output of the level shifter unit Lx1 to the output terminal OUT.

Therefore, the PMOS transistor P6 operates to supply its output to the output terminal OUT only when the output of the level shifter unit Lx1 is a signal having the level of VDD1.

Note that the level shifter unit Lx1 has the function of controlling its output according to the shutdown signal NOE, and therefore, can provide a fixed output even when the power supply voltage VDD3 is off.

Next, operation of the PMOS transistor P7 will be described. The output of the level shifter unit Lx2 is connected to the output terminal OUT through the PMOS transistor P7.

When both of the power supply voltages VDD1 and VDD2 are on, the PMOS transistor P7 receives the power supply voltage VDD1 which is the output VO1 of the substrate control circuit 6 at the substrate electrode thereof, and the power supply voltage VDD1 at the gate thereof, so that the PMOS transistor 7 is off, and therefore, the connection between the output of the level shifter unit Lx2 and the output terminal OUT is disconnected.

When the power supply voltage VDD1 is off and the power supply voltage VDD2 is on, the PMOS transistor P7 receives the power supply voltage VDD2 which is the output VO1 of the substrate control circuit 6 at the substrate electrode thereof, and the power supply voltage VDD1 received at the gate thereof is off, so that the PMOS transistor P7 is on, and therefore, outputs the output of the level shifter unit Lx2 to the output terminal OUT.

When the power supply voltage VDD1 is on and the power supply voltage VDD2 is off, the PMOS transistor P6 receives the power supply voltage VDD1 which is the output VO1 of the substrate control circuit 6 at the substrate electrode thereof, and the power supply voltage VDD1 at the gate thereof, so that the PMOS transistor 6 is off, and therefore, the connection between the output of the level shifter unit Lx2 and the output terminal OUT is disconnected. Note that, at this time, the output of the level shifter unit Lx2 is unstable because the power supply voltage VDD2 as power supply is off.

Therefore, the PMOS transistor P7 operates to supply the output of the level shifter unit Lx2 to the output terminal OUT only when the power supply voltage VDD1 is off and the power supply voltage VDD2 is on.

Note that the level shifter unit Lx2 has the function of controlling its output according to the shutdown signal NOE, and therefore, can provide a fixed output even when the power supply voltage VDD3 is off.

The NMOS transistor N5 is an auxiliary circuit for speeding up the transition of the output terminal OUT to the high level (VDD1), and receives the output of the level shifter unit Lx1 at the gate thereof. Therefore, when the output of the level shifter unit Lx1 is at the high level (VDD1), the NMOS transistor N5 is on and outputs a high-level voltage (VDD1-Vthn) to the output terminal OUT, where Vthn represents the threshold voltage.

The NMOS transistor N6 is an auxiliary circuit for speeding up the transition of the output terminal OUT to the low level (VSS), and receives, at the gate thereof, a signal having the level of VDD1 which is the opposite logical value of the output of the level shifter unit Lx1 from the inverter INV2. Therefore, when the output of the level shifter unit Lx1 is at the low level (VSS), the gate of the NMOS transistor N6 receives a high-level voltage (VDD1), so that the NMOS transistor N6 is on, and outputs the low-level voltage (VSS) to the output terminal OUT.

Because the NMOS transistors N5 and N6 are used as a pull-up transistor and a pull-down transistor, an unwanted current which is due to a parasitic diode does not flow to the substrate even when the power supply voltage VDD1 is off, as with PMOS transistors.

The NMOS transistor N7 is an auxiliary circuit for speeding up the transition of the output terminal OUT to a high level (VDD2), and receives the output of the level shifter unit Lx2 at the gate thereof. Therefore, when the output of the level shifter unit Lx2 is at the high level (VDD2), the NMOS transistor N7 is on, and therefore, outputs a high-level voltage (VDD2-Vthn) to the output terminal OUT, where Vthn represents the threshold voltage.

The NMOS transistor N8 is an auxiliary circuit for speeding up the transition of the output terminal OUT to the low level (VSS), and receives, at the gate thereof, a signal having the level of VDD2 which is the opposite logical value of the output of the level shifter unit Lx2 from the inverter INV3. Therefore, when the output of the level shifter unit Lx2 is at the low level (VSS), the NMOS transistor N8 receives a high-level voltage (VDD2) at the gate thereof, so that the NMOS transistor N8 is on, and therefore, outputs the low-level voltage (VSS) to the output terminal OUT.

Because the NMOS transistors N5 and N6 are used as a pull-up transistor and a pull-down transistor, an unwanted current which is due to a parasitic diode does not flow to the substrate even when the power supply voltage VDD1 is off, as with PMOS transistors.

Next, circuit operation of the entire third level shifter circuit configuration of FIG. 5 will be described.

(When All Power Supplies Are On)

When the power supply voltages VDD1-VDD3 are all on, the output VO1 of the substrate control circuit 6 is the power supply voltage VDD1. In this case, as described above, the PMOS transistor P6 is on, and the PMOS transistor P7 is off, and therefore, the level shifter unit Lx1 outputs a signal having the level of VDD1 to the output terminal OUT.

When the low-level voltage (VSS) is output to the output terminal OUT, the NMOS transistors N5 and N7 as pull-up transistors are off and the NMOS transistors N6 and N8 as pull-down transistors are on as described above, and therefore, a leakage current does not occur.

When a high-level voltage (VDD1) is output to the output terminal OUT, the NMOS transistors N5 and N7 as pull-up transistors are on and the NMOS transistors N6 and N8 as pull-down transistors are off. The NMOS transistor N5 has the power supply voltage VDD1 at the gate, source, and drain thereof, and therefore, a leakage current does not occur. The NMOS transistor N7 has the power supply voltage VDD2 at the gate and source thereof, and the power supply voltage VDD1 at the drain thereof, and therefore, a leakage current does not occur.

(When Any of Power Supplies is Off)

Operation performed when any of the power supply voltages VDD1-VDD3 is off will now be described.

a) First Power Supply State

When the power supply voltage VDD3 is off, the power supply voltage VDD1 is on, and the power supply voltage VDD2 is on, which state is referred to as a first power supply state, the output VO1 of the substrate control circuit 6 has the power supply voltage VDD1. In this case, as described above, the PMOS transistor P6 is on and the PMOS transistor P7 is off, and therefore, the level shifter unit Lx1 outputs a signal having the level of VDD1 to the output terminal OUT.

While the input signal of the level shifter unit Lx1 is unstable, the output of the level shifter unit Lx1 can be fixed according to the shutdown signal NOE provided to the level shifter unit Lx1. Therefore, for example, the transistors P1, P2, and N1 may be controlled to be off so that a current does not flow between each electrode.

b) Second Power Supply State

When the power supply voltage VDD3 is off, the power supply voltage VDD1 is on, and the power supply voltage VDD2 is off, which state is referred to as a second power supply state, the output VO1 of the substrate control circuit 6 has the power supply voltage VDD1. In this case, as described above, the PMOS transistor P6 is on and the PMOS transistor P7 is off, and therefore, the level shifter unit Lx1 outputs a signal having the level of VDD1 to the output terminal OUT.

While the input signal of the level shifter unit Lx1 is unstable, the output of the level shifter unit Lx1 can be fixed according to the shutdown signal NOE provided to the level shifter unit Lx1. Therefore, for example, the transistors P1, P2, and N2 may be controlled to be off so that a current does not flow between each electrode.

When the low-level voltage (VSS) is output to the output terminal OUT, the NMOS transistors N5 and N7 are off, the NMOS transistor N8 is off, and the NMOS transistor N6 is on as described above, and therefore, a leakage current does not occur.

When a high-level voltage (VDD1) is output to the output terminal OUT, the NMOS transistor N5 is on, the NMOS transistor N7 is off, and the NMOS transistors N6 and N8 are off. The NMOS transistor N5 has the power supply voltage VDD1 at the gate, source, and drain thereof, and therefore, a leakage current does not occur.

c) Third Power Supply State

When the power supply voltage VDD3 is off, the power supply voltage VDD1 is off, and the power supply voltage VDD2 is on, which state is referred to as a third power supply state, the output VO1 of the substrate control circuit 6 has the power supply voltage VDD2. In this case, as described above, the PMOS transistor P6 is off and the PMOS transistor P7 is on, and therefore, the level shifter unit Lx2 outputs a signal having the level of VDD2 to the output terminal OUT.

While the input signal of the level shifter unit Lx2 is unstable, the output of the level shifter unit Lx2 can be fixed according to the shutdown signal NOE provided to the level shifter unit Lx2. Therefore, for example, the transistors P1, P2, and N2 may be controlled to be off so that a current does not flow between each electrode.

When the low-level voltage (VSS) is output to the output terminal OUT, the NMOS transistors N5 and N7 are off, the NMOS transistor N6 is off, and the NMOS transistor N8 is on as described above, and therefore, a leakage current does not occur.

When a high-level voltage (VDD2) is output to the output terminal OUT, the NMOS transistor N7 is on, the NMOS transistor N5 is off, and the NMOS transistors N6 and N8 are off. The NMOS transistor N7 has the power supply voltage VDD2 at the gate, source, and drain thereof, and therefore, a leakage current does not occur.

d) Fourth Power Supply State

When the power supply voltage VDD3 is on and any of the power supply voltages VDD1 and VDD2 is off, which state is referred to as a fourth power supply state, the same operation as that performed in the above second or third power supply state is performed, and therefore, will not here be described.

As described above, in the third level shifter circuit configuration of FIG. 5, when the power supply voltage VDD1 is on, a signal having the level of VDD1 is output to the output terminal OUT. When the power supply voltage VDD1 is off and the power supply voltage VDD2 is on, a signal having the level of VDD2 is output to the output terminal OUT.

Here, in the semiconductor integrated circuit of FIG. 2, if the third level shifter circuit configuration of FIG. 5 is used as the level shifter L2 and the fourth level shifter circuit configuration is used as the level shifter L3, the entire circuit performs the same operation as that of the above second example, and will not here be described. Note that, as described above, the fourth level shifter circuit configuration is the circuit configuration of FIG. 5 in which the output control units Ly1 and Ly2 have the same circuits, and the level shifter units Lx1 and Lx2 have the second level shifter circuit configuration of FIG. 8 instead of the first level shifter circuit configuration of FIG. 7. Note that the level shifter unit Lx2 in the fourth level shifter circuit configuration has the second level shifter circuit configuration of FIG. 8 in which the power supply voltage VDD1 is replaced with the power supply voltage VDD2.

Note that the PMOS transistors P1 and P2 of FIG. 2 receives, at the substrate electrodes thereof, the higher one of the power supply voltages VDD1 and VDD2 as the output VO1 under the control of the substrate control circuit 6.

Thus, according to this embodiment, a semiconductor integrated circuit can be provided in which when any of the power supplies is off, an unwanted leakage current which is due to a parasitic diode element, etc., does not occur. In this embodiment, as described above, when any of the power supply voltages VDD1 and VDD2 is on, all of the transistors P1, P2, and N2 can be controlled, and therefore, the power supply voltage VOUT output by the power supply output terminal 13 can be arbitrarily controlled, leading to a wide variety of applications.

Third Embodiment

Figure 6:
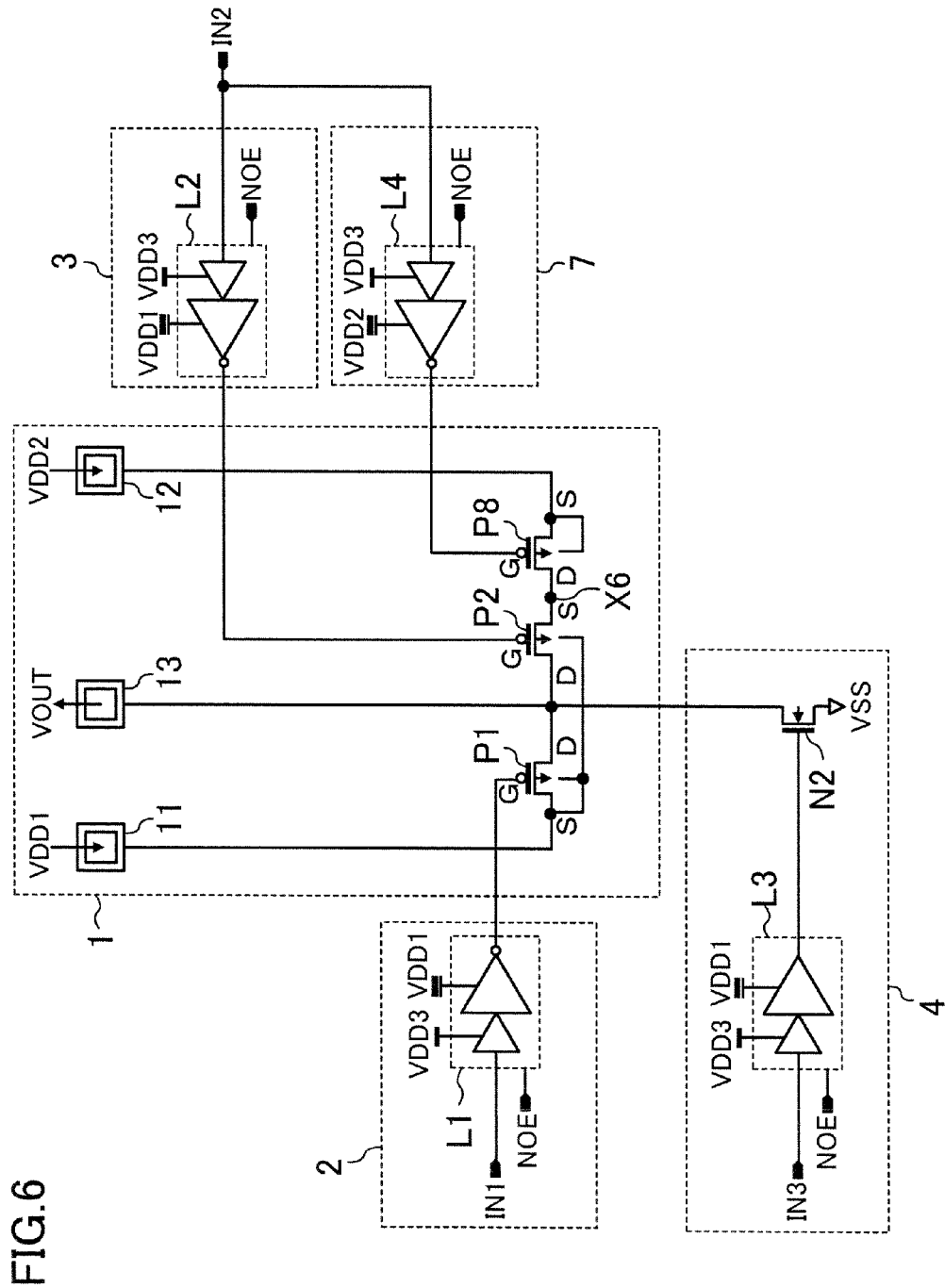
FIG. 6 is a circuit diagram showing a semiconductor integrated circuit according to a third embodiment.

A semiconductor integrated circuit according to a third embodiment will now be described with reference to the drawings. FIG. 6 is a circuit diagram showing the semiconductor integrated circuit according to the third embodiment. Note that substantially the same configuration as that of the first and second embodiments may not be redundantly described.

The semiconductor integrated circuit includes: a power supply switch circuit 1 which selects a power supply voltage VDD1 applied to a power supply input terminal 11 or a power supply voltage VDD2 applied to a power supply input terminal 12 using PMOS transistors P1, P2, and P8, and outputs the selected voltage as a power supply voltage VOUT to a power supply output terminal 13; a switch control circuit 2 which is connected to the gate of the PMOS transistor P1; a switch control circuit 3 which is connected to the gate of the PMOS transistor P2; a discharge circuit 4 which is connected to the power supply output terminal 13; and a switch control circuit 7 which is connected to the gate of the PMOS transistor P8. The power supply input terminal 11 and the power supply output terminal 13 are connected together by the PMOS transistor P1. The power supply input terminal 12 and the power supply output terminal 13 are connected together by the two PMOS transistors P2 and P8 connected together in series. By switching these three PMOS transistors P1, P2, and P8, a voltage applied to the power supply input terminal 11 or the power supply input terminal 12 is output through the power supply output terminal 13.

The power supply switch circuit 1 includes: the PMOS transistor P1 having a source connected to the power supply input terminal 11, a drain connected to the power supply output terminal 13, a gate connected to the output of the switch control circuit 2, and a substrate electrode connected to the power supply input terminal 11; the PMOS transistor P2 having a source connected to a node X6 (the drain of the PMOS transistor P8), a drain connected to the power supply output terminal 13, a gate connected to the output of the switch control circuit 3, and a substrate electrode connected to the power supply input terminal 11; and the PMOS transistor P8 having a source connected to the power supply input terminal 12, a drain connected to the node X6 (the source of the PMOS transistor P2), a gate connected to the output of a switch control circuit 7, and a substrate electrode connected to the power supply input terminal 12.

The switch control circuit 2 of FIG. 6 has the same configuration as that of the switch control circuit 2 of FIG. 1. The level shifter L1 has the first level shifter circuit configuration of FIG. 7.

The discharge circuit 4 of FIG. 6 has the same configuration as that of the discharge circuit 4 of FIG. 1. The level shifter L3 has the second level shifter circuit configuration of FIG. 8.

The switch control circuit 3 of FIG. 6, which includes the level shifter L2, outputs a signal ranging from the level of the ground potential VSS to the level of the power supply voltage VDD1 to the gate of the PMOS transistor P2 so that the PMOS transistor P2 is controlled to be on or off. The level shifter L2, which has the same circuit configuration as that of the level shifter L1, converts a signal having the level of the power supply voltage VDD3 into a signal having the level of the power supply voltage VDD1. The level shifter L2 has the first level shifter circuit configuration of FIG. 7.

The switch control circuit 7 of FIG. 6, which includes a level shifter L4, outputs a signal ranging from the level of the ground potential VSS to the level of the power supply voltage VDD2 to the gate of the PMOS transistor P8 so that the PMOS transistor P8 is controlled to be on or off. The level shifter L4 converts a signal having the level of the power supply voltage VDD3 into a signal having the level of the power supply voltage VDD2. The level shifter L4 has the first level shifter circuit configuration of FIG. 7 in which the power supply voltage VDD1 is replaced with the power supply voltage VDD2.

When the shutdown signal NOE is at the low level (0 V), the level shifters L1, L2, and L4 output signals having the opposite logical values of the input signals IN1 and IN2, and the level shifter L3 outputs a signal having the same logical value of the input signal IN3.

When the shutdown signal NOE is at the high level (3.3 V), the outputs of the level shifters L1 and L2 are fixed to a high level (VDD1), the output of the level shifter L4 is fixed to a high level (VDD2), and the output of the level shifter L3 is fixed to the low level (VSS), irrespective of the state of the input signal, even when the power supply voltage VDD3 is off.

In the above embodiment, for example, when the power supply input terminal 11 (VDD1) and the power supply input terminal 12 (VDD2) are connected together, or the power supply input terminal 11 (VDD1) and a ground terminal (VSS) are connected together, by the PMOS transistor P1, P2, or P8, the NMOS transistor N2, etc., an unwanted current flows between power supplies, leading to a device breakdown, latchup, or malfunction. Therefore, these transistors are normally controlled exclusively from each other.

Specifically, when the PMOS transistor P1 is on, the other transistors, i.e., the PMOS transistors P2 and P8 and the NMOS transistor N2, are controlled to be off. When the PMOS transistors P2 and P8 are on, the other transistors, i.e., the PMOS transistors P1 and the NMOS transistor N2, are controlled to be off. When the NMOS transistor N2 is on, the other transistors, i.e., the PMOS transistors P1, P2, and P8, are controlled to be off.

Next, operation in each power supply state of the semiconductor integrated circuit of the third embodiment will be described.

(When All Power Supplies Are On)

When the power supply voltages VDD1-VDD3 are all on, normal operation is performed in which the transistors P1, P2, P8, and N2 are controlled according to the input signals IN1-IN3 to select one of the power supply voltage VDD1 applied to the power supply input terminal 11 and the power supply voltage VDD2 applied to the power supply input terminal 12, and output the selected power supply voltage as the power supply voltage VOUT to the power supply output terminal 13. At this time, the shutdown signal NOE is assumed to be at the low level (VSS).

Specifically, when the power supply voltage VDD1 is output as the power supply voltage VOUT, the input signal IN1 is caused to be at the high level (VDD3) and the input signals IN2 and IN3 are caused to be at the low level (VSS) so that the low-level voltage (VSS) is output to the gate of the PMOS transistor P1, a high-level voltage (VDD1) is output to the gate of the PMOS transistor P2, a high-level voltage (VDD2) is output to the gate of the PMOS transistor P8, and the low-level voltage (VSS) is output to the gate of the NMOS transistor N2. As a result, the PMOS transistor P1 is controlled to be on, and the PMOS transistors P2 and P8 and the NMOS transistor N2 are controlled to be off, and therefore, the power supply input terminal 11 and the power supply output terminal 13 are electrically connected together by the PMOS transistor P1. As a result, the power supply voltage VDD1 applied to the power supply input terminal 11 is output as the power supply voltage VOUT through the power supply output terminal 13. At this time, the substrate electrode of the PMOS transistor P2 which is directly connected to the power supply output terminal 13, is connected to the power supply input terminal 11 and therefore has the power supply voltage VDD1, and therefore, an unwanted current which is due to a parasitic diode does not flow to the substrate.

When the power supply voltage VDD2 is output as the power supply voltage VOUT, the input signal IN2 is caused to be at the high level (VDD3) and the input signals IN1 and IN3 are caused to be at the low level (VSS) so that the low-level voltage (VSS) is output to the gates of the PMOS transistors P2 and P8, a high-level voltage (VDD1) is output to the gate of the PMOS transistor P1, and the low-level voltage (VSS) is output to the gate of the NMOS transistor N2. As a result, the PMOS transistors P2 and P8 are controlled to be on, and the PMOS transistor P1 and the NMOS transistor N2 are controlled to be off, and therefore, the power supply input terminal 12 and the power supply output terminal 13 are electrically connected together by the PMOS transistors P2 and P8. As a result, the power supply voltage VDD2 applied to the power supply input terminal 12 is output as the power supply voltage VOUT through the power supply output terminal 13.

(When Any of Power Supplies is Off)

Operation performed when any of the power supply voltages VDD1-VDD3 is off will now be described.

a) First Power Supply State

When the power supply voltage VDD3 is off, the power supply voltage VDD1 is on, and the power supply voltage VDD2 is on, which state is referred to as a first power supply state, the input signals IN1, IN2, and IN3 for controlling the transistors P1, P2, P8, and N2 are unstable. Therefore, the output signals of the level shifters L1-L4 are controlled according to the shutdown signal NOE provided to the level shifters L1-L4 so that the transistors P1, P2, P8, and N2 are controlled to be off, and therefore, a current does not flow between each electrode.

Specifically, the shutdown signal NOE is caused to be at the high level (3.3 V). As a result, irrespective of the states of the input signals IN1-IN3, the level shifter L1 outputs a high-level voltage (VDD1) to the gate of the PMOS transistor P1, the level shifter L2 outputs a high-level voltage (VDD1) to the gate of the PMOS transistor P2, the level shifter L4 outputs a high level (VDD2) to the gate of the PMOS transistor P8, and the level shifter L3 outputs the low-level voltage (VSS) to the gate of the NMOS transistor N2. As a result, the transistors P1, P2, P8, and N2 are off. In this embodiment, the transistors P1, P2, P8, and N2 are all controlled to be off. Alternatively, the configuration of the level shifter may be changed so that the PMOS transistor P1 is on and the PMOS transistors P2 and P8 and the NMOS transistor N2 are off, whereby the power supply input terminal 11 and the power supply output terminal 13 are electrically connected together, and therefore, the power supply voltage VDD1 can be supplied as the power supply voltage VOUT.

b) Second Power Supply State

When the power supply voltage VDD3 is off, the power supply voltage VDD1 is on, and the power supply voltage VDD2 is off, which state is referred to as a second power supply state, the output of the level shifter L4 cannot be controlled according to the shutdown signal NOE, even if the shutdown signal NOE is at the high level (3.3 V). However, the output of the level shifter L2 is controlled according to the shutdown signal NOE, and therefore, a high-level voltage (VDD1) is output from the level shifter L2 to the gate of the PMOS transistor P2, so that the PMOS transistor P2 is off. Therefore, a current does not leak to the power supply input terminal 12 through the PMOS transistors P2 and P8.

c) Third Power Supply State

When the power supply voltage VDD3 is off, the power supply voltage VDD1 is off, and the power supply voltage VDD2 is on, which state is referred to as a third power supply state, the outputs of the level shifters L1, L2, and L3 cannot be controlled according to the shutdown signal NOE, even if the shutdown signal NOE is at the high level (3.3 V). However, the output of the level shifter L4 is controlled according to the shutdown signal NOE, and therefore, a high level (VDD2) is output from the level shifter L4 to the gate of the PMOS transistor P8, so that the PMOS transistor P8 is off. Therefore, a current does not leak to the power supply input terminal 12 through the PMOS transistors P2 and P8.

d) Fourth Power Supply State

When the power supply voltage VDD3 is on, and any of the power supply voltages VDD1 and VDD2 is off, which state is referred to as a fourth power supply state, the same operation as that performed in the above second or third power supply state is performed, and therefore, will not here be described.

As described above, according to this embodiment, a semiconductor integrated circuit can be provided in which even when any of the power supplies is off, an unwanted leakage current which is due to a parasitic diode element, etc., does not occur.

Note that the level shifters used in the first to third embodiments are merely illustrative. Any other circuit that has a similar function may be used.

In actual LSI design, the power supply input terminal 11, the power supply input terminal 12, and the power supply output terminal 13 serve as external terminals of an LSI package, and are each typically provided with a bypass capacitor external to the LSI so that power supply is stabilized.

Note that when the impedance between the power supply output terminal 13 and the power supply input terminal 11 or 12 is relatively low, the bypass capacitor provided for the power supply input terminal 11 or 12 can be expected to work, and therefore, a bypass capacitor may not be provided for the power supply output terminal 13, which may not serve as an external terminal of the LSI package.

For the layout of the power supply switch circuit, it is necessary to provide a sufficient allowable current and reduce the resistance for each of the interconnects of the power supply input terminal 11, the power supply input terminal 12, and the power supply output terminal 13. Therefore, if, on each MOS transistor, interconnects are alternately arranged, this is advantageous in terms of area and electrical characteristics. For example, when power is supplied to an I/O circuit through the power supply output terminal 13, the interconnect shape of the power supply output terminal 13 is caused to match the shapes of the main power supply interconnects of I/O circuits for connecting the I/O circuits together, that are provided in the I/O circuits, whereby the bending of an interconnect, the changing of interconnects, etc., can be eliminated or reduced, leading to an advantage in terms of area and electrical characteristics.

As described above, the present disclosure provides a power supply switch circuit which is useful because even when any of power supply voltages is off, an unwanted current which is due to a parasitic diode, etc., does not occur, and therefore, problems, such as a device breakdown, latchup, malfunction, etc., can be prevented or reduced.

What is claimed is:

1. A semiconductor integrated circuit comprising:
a ground terminal configured to receive a ground potential;
a first power supply terminal configured to receive a first power supply voltage higher than the ground potential;
a second power supply terminal configured to receive a second power supply voltage higher than the ground potential and lower than the first power supply voltage;
a third power supply terminal configured to output the first power supply voltage received by the first power supply terminal or the second power supply voltage received by the second power supply terminal;
a first PMOS transistor configured to connect the first and third power supply terminals together;
a first NMOS transistor configured to connect the second and third power supply terminals together;
a first switch control circuit connected to the first PMOS transistor; and
a second switch control circuit connected to the first NMOS transistor,
wherein
the first switch control circuit outputs a signal ranging from the level of the ground potential to the level of the first power supply voltage to a gate of the first PMOS transistor, to control the first PMOS transistor so that the first PMOS transistor is on or off, and
the second switch control circuit outputs a signal ranging from the level of the ground potential to the level of the first power supply voltage to a gate of the first NMOS transistor, to control the first NMOS transistor so that the first NMOS transistor is on or off.

2. The semiconductor integrated circuit of claim 1, further comprising:
a discharge circuit configured to connect the third power supply terminal and the ground terminal together.

3. The semiconductor integrated circuit of claim 2, wherein
the first NMOS transistor, the first PMOS transistor, and the discharge circuit are controlled exclusively from each other.

4. The semiconductor integrated circuit of claim 1, wherein
the first NMOS transistor and the first PMOS transistor are controlled exclusively from each other.

5. The semiconductor integrated circuit of claim 1, wherein
a substrate electrode of the first PMOS transistor is connected to the first power supply terminal.

6. The semiconductor integrated circuit of claim 1, wherein
a substrate electrode of the first NMOS transistor is connected to the ground terminal.

7. The semiconductor integrated circuit of claim 1, further comprising:
a pull-down circuit connected to the gate of the first NMOS transistor and configured to pull the gate voltage of the first NMOS transistor down to the level of the ground potential according to a pull-down control signal.

8. A semiconductor integrated circuit comprising:
a ground terminal configured to receive a ground potential;
a first power supply terminal configured to receive a first power supply voltage higher than the ground potential;
a second power supply terminal configured to receive a second power supply voltage higher than the ground potential and lower than the first power supply voltage;
a third power supply terminal configured to output the first power supply voltage received by the first power supply terminal or the second power supply voltage received by the second power supply terminal;
a first PMOS transistor configured to connect the first and third power supply terminals together;
a second PMOS transistor configured to connect the second and third power supply terminals together;
a first switch control circuit connected to the first PMOS transistor;
a second switch control circuit connected to the second PMOS transistor; and
a substrate control circuit having an output connected to a substrate electrode of the second PMOS transistor,
wherein
the substrate control circuit receives the first and second power supply voltages as power supply, and outputs the higher one of the first and second power supply voltages.

9. The semiconductor integrated circuit of claim 8, further comprising:
a discharge circuit configured to connect the third power supply terminal and the ground terminal together.

10. The semiconductor integrated circuit of claim 8, wherein
a substrate electrode of the first PMOS transistor is connected to the output of the substrate control circuit.

11. The semiconductor integrated circuit of claim 8, wherein
the second switch control circuit outputs a signal ranging from the level of the ground potential to the level of the first power supply voltage to a gate of the second PMOS transistor, to control the second PMOS transistor so that the second PMOS transistor is on or off.

12. The semiconductor integrated circuit of claim 8, wherein
the second switch control circuit receives a voltage output by the substrate control circuit as power supply, and outputs a signal ranging from the level of the ground potential to the level of the first power supply voltage or a signal ranging from the level of the ground potential to the level of the second power supply voltage, to a gate of the second PMOS transistor, to control the second PMOS transistor so that the second PMOS transistor is on or off.

13. The semiconductor integrated circuit of claim 8, wherein
the second switch control circuit includes
an input terminal configured to receive an input signal,
an output terminal configured to output an output signal,
a first output circuit configured to output a signal ranging from the level of the ground potential to the level of the first power supply voltage according to the input signal,
a second output circuit configured to output a signal ranging from the level of the ground potential to the level of the second power supply voltage according to the input signal,
a third PMOS transistor configured to connect the first output circuit and the output terminal together, and
a fourth PMOS transistor configured to connect the second output circuit and the output terminal together, a gate of the third PMOS transistor receives the second power supply voltage, and a substrate electrode of the third PMOS transistor is connected to the output of the substrate control circuit, and a gate of the fourth PMOS transistor receives the first power supply voltage, and a substrate electrode of the fourth PMOS transistor is connected to the output of the substrate control circuit.

14. The semiconductor integrated circuit of claim 13, wherein
the second switch control circuit includes
a first pull-down circuit connected to the output terminal and configured to pull the voltage of the output terminal down to the ground potential according to the signal outputted from the first output circuit.

15. The semiconductor integrated circuit of claim 13, wherein
the second switch control circuit includes
a second pull-down circuit connected to the output terminal and configured to pull the voltage of the output terminal down to the ground potential according to the signal outputted from the second output circuit.

16. The semiconductor integrated circuit of claim 13, wherein
the second switch control circuit includes
a first pull-up circuit connected to the output terminal and configured to pull the voltage of the output terminal up to the first power supply voltage according to the signal outputted from the first output circuit.

17. The semiconductor integrated circuit of claim 13, wherein
the second switch control circuit includes
a second pull-up circuit connected to the output terminal and configured to pull the voltage of the output terminal up to the second power supply voltage according to the signal outputted from the second output circuit.

18. A semiconductor integrated circuit comprising:
a ground terminal configured to receive a ground potential;
a first power supply terminal configured to receive a first power supply voltage higher than the ground potential;
a second power supply terminal configured to receive a second power supply voltage higher than the ground potential and lower than the first power supply voltage;
a third power supply terminal configured to output the first power supply voltage received by the first power supply terminal or the second power supply voltage received by the second power supply terminal;
a first PMOS transistor configured to connect the first and third power supply terminals together;
a second PMOS transistor configured to connect the third power supply terminal and a first node together;
a third PMOS transistor configured to connect the first node and the second power supply terminal together;
a first switch control circuit connected to the first PMOS transistor;
a second switch control circuit connected to the second PMOS transistor; and
a third switch control circuit connected to the third PMOS transistor,
wherein
a substrate electrode of the second PMOS transistor is connected to the first power supply terminal,
a substrate electrode of the third PMOS transistor is connected to the second power supply terminal,
the first switch control circuit outputs a signal ranging from the level of the ground potential to the level of the first power supply voltage to a gate of the first PMOS transistor, to control the first PMOS transistor so that the first PMOS transistor is on or off,
the second switch control circuit outputs a signal ranging from the level of the ground potential to the level of the first power supply voltage to a gate of the second PMOS transistor, to control the second PMOS transistor so that the second PMOS transistor is on or off, and
the third switch control circuit outputs a signal ranging from the level of the ground potential to the level of the second power supply voltage to a gate of the third PMOS transistor, to control the third PMOS transistor so that the third PMOS transistor is on or off.

19. The semiconductor integrated circuit of claim 18, further comprising:
a discharge circuit configured to connect the third power supply terminal and the ground terminal together.

20. The semiconductor integrated circuit of claim 18, wherein
a substrate electrode of the first PMOS transistor is connected to the first power supply terminal.

* * * * *